(12) United States Patent
De Petris

(10) Patent No.: US 6,327,128 B1
(45) Date of Patent: Dec. 4, 2001

(54) AUTOMOTIVE BRIDGE RECTIFIER ASSEMBLY WITH THERMAL PROTECTION

(75) Inventor: Peter S. De Petris, Youngstown, NY (US)

(73) Assignee: Electro-Dyn Electronics Corporation, Niagara Falls, NY (US)

( * ) Notice: Subject to any disclaimer, the term of this patent is extended or adjusted under 35 U.S.C. 154(b) by 0 days.

(21) Appl. No.: 09/412,931

(22) Filed: Oct. 5, 1999

Related U.S. Application Data
(60) Provisional application No. 60/103,682, filed on Oct. 8, 1998, provisional application No. 60/103,412, filed on Oct. 7, 1998, provisional application No. 60/129,738, filed on Apr. 16, 1999, and provisional application No. 60/139,998, filed on Jun. 18, 1999.

(51) Int. Cl.$^7$ ........................................................ H02H 5/04
(52) U.S. Cl. ............................................. 361/103; 361/104
(58) Field of Search ................................... 361/103–104, 361/93.8, 18; 363/52–53, 145; 307/10.1, 10.7; 310/68 D

(56) References Cited

U.S. PATENT DOCUMENTS

| | | | |
|---|---|---|---|
| 4,349,813 | * 9/1982 | Ishibashi et al. | 340/638 |
| 4,635,044 | * 1/1987 | South | 340/638 |
| 4,799,309 | 1/1989 | Cinzori et al. | 29/596 |
| 5,005,069 | 4/1991 | Wasmer et al. | 357/72 |
| 5,043,614 | 8/1991 | Yockey | 310/68 |
| 5,453,901 | * 9/1995 | Lackey | 361/21 |
| 5,659,212 | 8/1997 | DePetris | 310/68 |

OTHER PUBLICATIONS

"Introducing The Renard CS130 Series!," 1 page, The Globe, March 1997.

"Ford IAR Burnup," Wai—Wetherill Associates, Inc., Nov. 1992.

"Preventing Fire Hazards on the Ford IAR Integral Alternator," 1 page, Renard Reader, Feb. 1992.

"Weigh Benefits of CS–130 Salvaged Components," 3 pages, Electrical Rebuilder's Exchange, Dec. 1998.

"Adequate Vehicular Electrical Protection Important," 1 page, Electrical Rebuilder's Exchange, Mar. 1998.

"Heat Transfer Compound And Electrical Contact Gel are not the Same," 1 page, Renard Reader, Jun. 1992.

"Reliability in Rectifiers for Late Model Ford Integral: The Answer is Quality Workmanship," 1 page, Renard Reader, Sep. 1991.

"Solving the Mystery of Regulator Failure," 1 page, Electrical Rebuilder's Exchange, Aug. 1995.

P. Moore, "Prepare Now for the CS130D," 1 page, Electrical Rebuilder's Exchange, Apr. 1996.

N. De Nardis, "Delco CS–Series Heat Problems," 2 pages, Automotive Rebuilder, Mar. 1995.

* cited by examiner

*Primary Examiner*—Michael J. Sherry
(74) *Attorney, Agent, or Firm*—Knobbe, Martens, Olson & Bear, LLP

(57) ABSTRACT

A rectifier assembly employs a set of diodes to rectify alternating current from an alternator to direct current for use by the electrical system of an automobile. The rectifier includes a plurality of thermal safety disconnects coupled along circuit paths within the rectifier assembly. When the resultant temperature caused by the heat provided to the safety disconnect as a result of the diodes overheating is above a threshold level, the safety disconnect melts away to disconnect the circuit path associated with the safety disconnect.

8 Claims, 21 Drawing Sheets

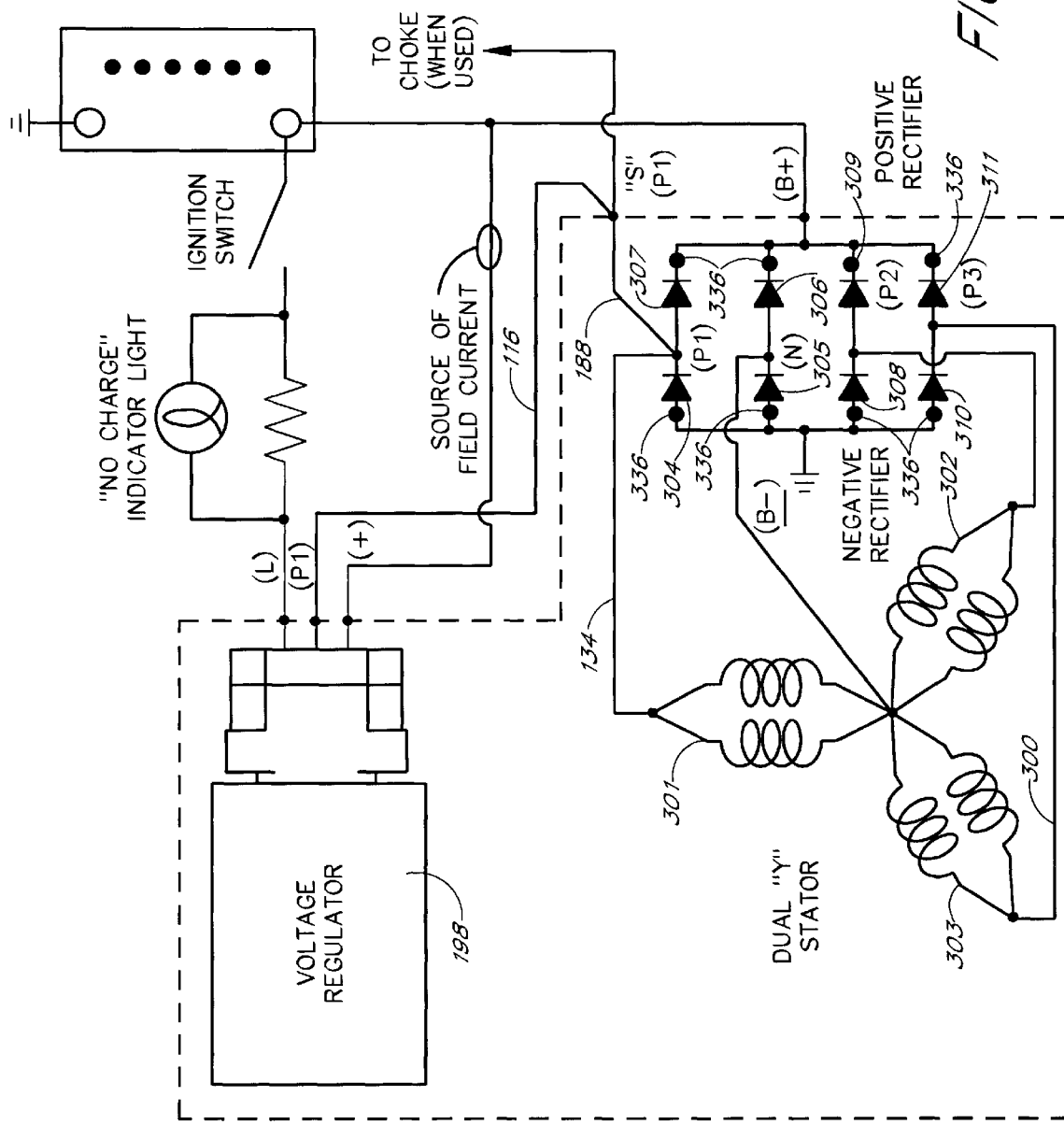

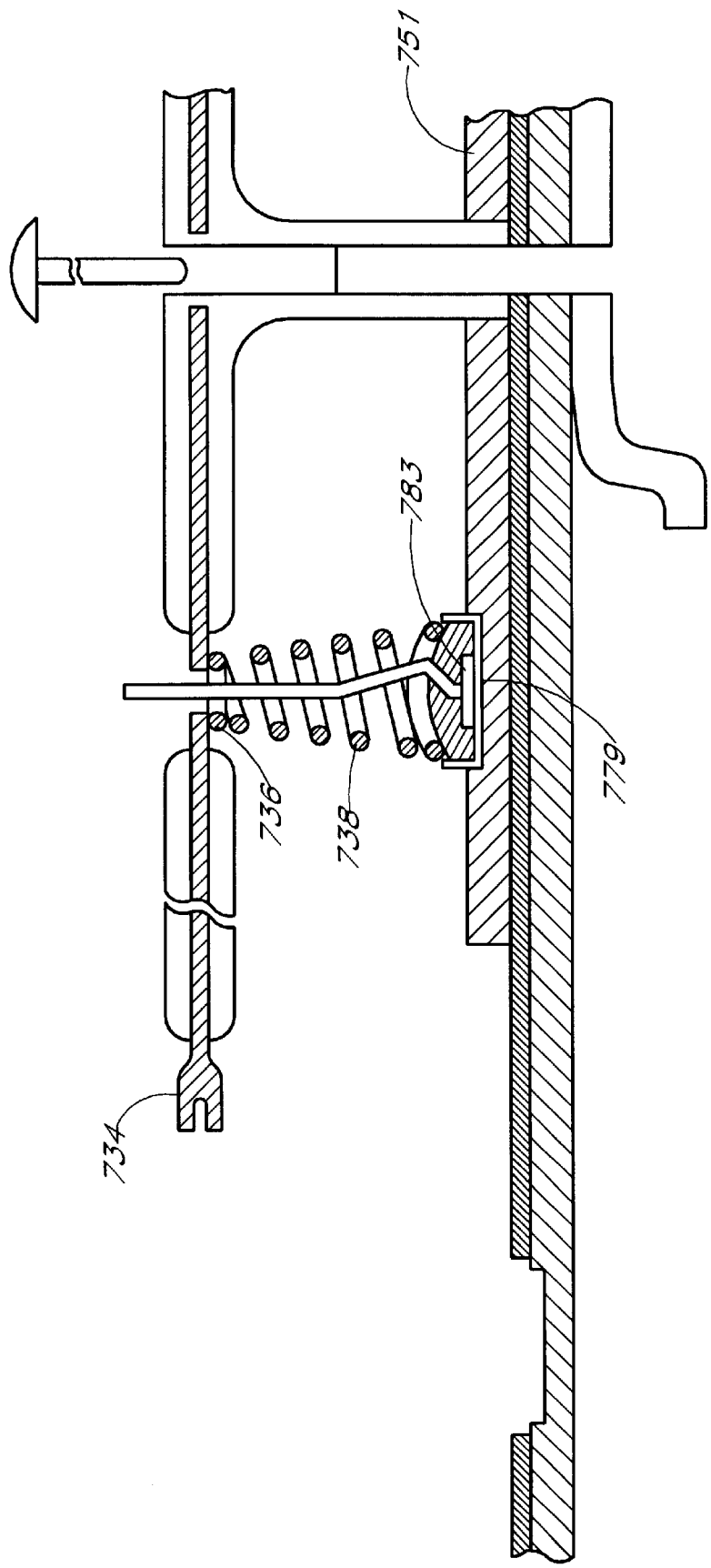

AUTOMOTIVE BRIDGE RECTIFIER ASSEMBLY WITH THERMAL PROTECTION

CLAIM OF BENEFIT OF PRIORITY

This application claims the benefit of priority under 35 U.S.C. §119(e) to U.S. Provisional Patent Application No. 60/103,682, entitled RECTIFIER ASSEMBLY FOR AUTOMOTIVE ALTERNATORS, filed Oct. 8, 1998, U.S. Provisional Patent Application No. 60/103,412, entitled RECTIFIER ASSEMBLY FOR AUTOMOTIVE ALTERNATORS, filed Oct. 7, 1998, U.S. Provisional Patent Application No. 60/129,738, entitled RECTIFIER ASSEMBLY FOR AUTOMOTIVE ALTERNATORS, filed Apr. 16, 1999, and U.S. Provisional Patent Application No. 60/139,998, entitled SEMICONDUCTOR DIODE WITH BUILT IN THERMAL PROTECTION, filed Jun. 18, 1999.

BACKGROUND OF THE INVENTION

1. Field of the Invention

The present invention relates to the field of automotive rectifier assemblies. Particularly, the present invention relates to a method and apparatus for preventing rectifier assemblies from overheating.

2. Description of the Related Art

Advances in technology have allowed for a reduction in the size of automotive alternators (herein "alternators"). Although alternators have become smaller, the electrical energy output requirements have increased. Generally, recharging an automobile's battery requires a current between 40 and 50 amperes. Combined with the energy requirements of the air conditioning system, the computer module, the car radio, the fans, and the lighting systems, the overall current consumption can exceed 150 amperes.

The high current alternator is generally not able to dissipate heat out of the rectifier module fast enough to prevent semiconductor failure. The problem is particularly severe during the summer months, when the ambient temperature is quite high, thus reducing the rate of heat transfer between the rectifier module and the surrounding environment.

Polyphase alternating current can be converted to direct current suitable for use in an automotive electrical system by conducting current through semiconductor diodes in a rectifier circuit. The semiconductors may be affixed directly onto a heat sink, as is illustrated by U.S. Pat. No. 5,005,069, or press-fit into pre-punched holes in the heat sinks, as is illustrated by U.S. Pat. No. 5,043,614. In other methods, such as that illustrated in U.S. Pat. No. 4,799,309, the semiconductors are affixed onto integrated heat sinks. The heat control methods identified above are usually difficult to implement because the semiconductors are extremely sensitive to heat, stress, and mechanical force applied to the semiconductors during the manufacturing and installation. The stress can cause premature semiconductor failure during vehicle operation.

The likelihood of failure is especially great when the semiconductors of the rectifier assembly are affixed onto a single, integrated, aluminum heat sink. The semiconductors are usually encapsulated with heat conductive epoxy, which prevents the semiconductors from expanding or from dissipating heat efficiently. The semiconductor overheating and failure conditions has been historically demonstrated by the FORD IAR alternator catastrophic failure scenario. Therefore, there is a need for a method of ensuring that the rectifier assembly does not overheat when semiconductors fail while not overstressing the semiconductors during assembly.

Automotive power requirements utilizing a rectifier can exceed 70 amperes. With the present day high under-hood temperatures, along with the heat generated by the alternator and the rectifier, this high current cannot safely pass through the rectifier male terminal blades and into the female connector terminals when the terminals are not properly mated.

Most rectifier assemblies use three male terminal blades molded into a connector housing. The B+blades that supply the battery power are formed out of tin plated brass or steel and are bent into a "U" configuration (usually a square bend molded into a housing, and having no flexibility) to carry the high current. The third independent blade is used to transfer low amperage stator alternating current to the electric choke circuit.

In the prior art, when the original alternator, rectifier and connector are manufactured, assembled and installed by the manufacturer, the system operates quite well for several years. However, after operating for several years, under the stress of high current and high under-hood temperatures, the materials take on a preset form, or memory.

Replacing a failed alternator presents a major problem for the re-manufacturer and the installer because the installer must force and pry off the tightly fit female mating connector. After installing a remanufactured alternator, the mating connector is mechanically distorted, thermally aged, or has a preset memory. Thus, the connector terminal blades most likely will not align with the female receptacle terminals, creating a high resistance loose connection, causing arcing, over-heating, and introducing a fire hazard.

In an attempt to solve the problem, many large volume alternator re-manufacturers enclose a new connector plug with every alternator sold. This practice is extremely expensive, and cannot guarantee the rectifier contact blades will be properly aligned to provide a low resistance tightly fit connection after the installer forces the new connector into the re-manufactured alternator rectifier.

Other alternator re-manufacturers recommend that their customers perform a 6 pound pull test on the connector plug prior to plugging it into the newly installed alternator. A 6 pound weight is attached to a single male terminal blade. The blade is then plugged into each of the three female receptacles. If the weight causes the male blade to pull out of any one of the three female receptacles, the existing automobile's connector must be cut out and a new connector is spliced into the circuit. The installer must then force the new female connector from side to side, while pushing it downward into the male housing, allowing the male blades to enter into the female receptacles. This action causes the male blades to bend. Because the male terminal blades cannot self-align, they lose their required contact surface area, and create a high resistance connection. This connection becomes a hot spot within the connector housing because of the high operating current conducted through it. The extra heat generated within the re-manufactured alternator will not allow it to dissipate out of the rectifier. As heat continues to build up within the rectifier it either fails or becomes a fire hazard.

SUMMARY OF THE INVENTION

In accordance with the present invention, a rectifier assembly employs semiconductor circuits that automatically open whenever the semiconductors fail and dissipate a predetermined level of heat.

In one embodiment, the present invention utilizes spring-loaded terminals to connect the semiconductor circuits such that, when a failure occurs, the high temperature causes a preselected soldered joint to melt. Once melted, a compressed spring, under the joint, holds the terminals away from one another to open the failed circuit and stop the current flow.

In one embodiment, the rectifier assembly includes six spring-loaded diodes affixed onto two copper heat sinks. The heat sinks provide cooler and more efficient operation as described in U.S. Pat. No. 5,659,212, incorporated herein by reference.

The present invention is concerned with the high power and under-hood temperatures required by modern day automotive electronics and the catastrophic fire and melt down hazards caused by overheated semiconductors. The method of the present invention avoids overstressing the semiconductors by preventing the circuits from operating in a range of operation that is beyond the semiconductor's handling specifications. The thermal protection of the present invention virtually eliminates the automobile's catastrophic fire hazard, the dead battery nuisance conditions, and other conditions that are associated with semiconductor failures.

The present invention also offers a method for assembling rectifiers without overstressing the diodes in the process of securing the diodes to the rectifier assembly. The method includes providing a protective cup that is used to hold the semiconductor diode and absorb stress that may otherwise be absorbed by the semiconductor body.

The rectifier of the present invention employs a terminal connector that utilizes dimpled or detented (e.g., corrugated), spring-loaded, self-aligning male terminal blades to compensate for tolerances between all manufactured connectors. The terminal blades also compensate for the existing automobile connector which may be out of tolerance, because of thermal aging, mechanical abuse, or preset memory.

BRIEF DESCRIPTION OF THE DRAWINGS

FIG. 3B illustrates a Ford 3G rectifier bridge with thermal safety disconnects;

FIG. 7B illustrates a cross section of the pan type semiconductor assembly of FIG. 7A after a thermal failure condition;

DETAILED DESCRIPTION OF THE PREFERRED EMBODIMENT

Figure 1:
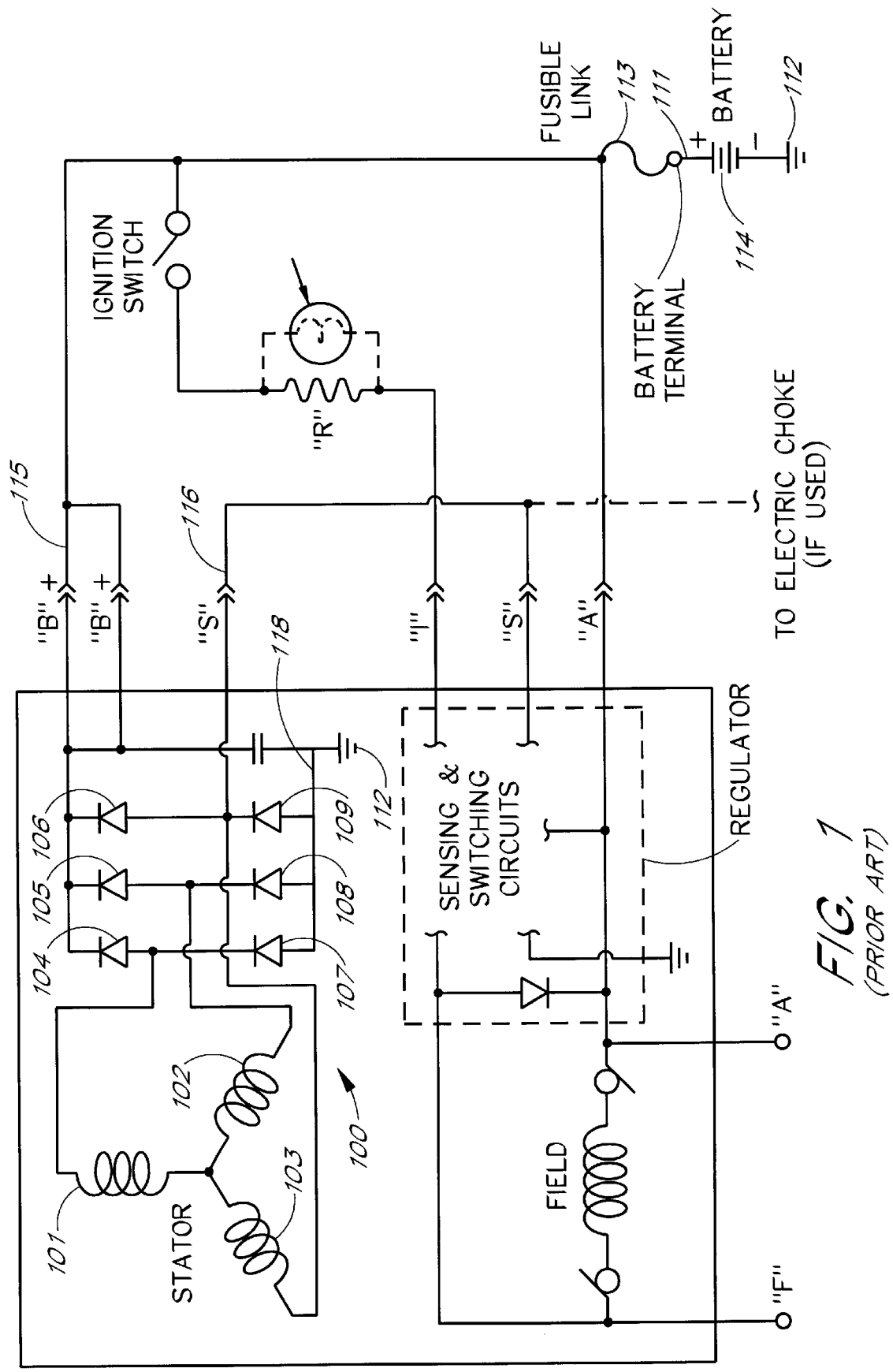
FIG. 1 illustrates a rectifier bridge alternator circuit.

The structure and operation of the semiconductor safety assembly of the present invention will be discussed with reference to embodiments of automotive rectifier assemblies. First, a problem associated with semiconductor diodes of automotive rectifier assemblies will be discussed. Second, several modification to existing rectifier assemblies will be illustrated. Next, the structure of semiconductor diode safety disconnects will be discussed with reference to illustrations of rectifier assemblies and diode pair assemblies.

Although the safety assemblies of the present invention are disclosed with reference to an automotive rectifier assembly, the disclosure is equally applicable to other circuits that employ semiconductor components that are susceptible to overheating as a result of a failure condition.

One problem solved by the safety assemblies of the present invention relates to alternator rectifier circuit semiconductor diode failures. Once an alternator is installed in a vehicle, all semiconductor diodes are electrically connected to the battery, completing a number of potential short circuit paths to the ground. The charging system's wiring harness usually incorporates a 12 AWG fuse link safety circuit, for fire and meltdown protection. The fuse, however, only provides an illusion of safety, as is discussed below.

Heat and voltage transients degenerate semiconductor switches and cause undesired reverse current leakage through the semiconductor junction. The leakage can lead to excessive junction heating. Once overheated, the semiconductor switch may be damaged beyond recovery. The semiconductor switch may also lose its blocking characteristics and allow current to flow in both directions. The excessive heat can then cascade into and damage other semiconductor switches of the same circuit.

Generally, there are no cut out relays or switches that open the semiconductor circuits of the rectifier system when a vehicle is shut down. Thus, the circuits usually remain electrically "HOT" when the vehicle is shut down. Further, the alternator's cooling system is also shut down when a vehicle is not operating, thus leaving the circuits thermally vulnerable. Latent heat remains in the thick rectifier housing and conducts back into the semiconductors. Thus, the alternator of the unattended shut-down vehicle is slowly heating up, as heat cascades from one semiconductor to another, causing semiconductor failures, and generating enough heat so as to potentially ignite an under-hood fire.

When the semiconductors fail, the current level is generally not high enough to melt the 12 AWG fuse. The semiconductors usually fail with a combined resistance of approximately 0.3 ohm. Thus, a 40 ampere current flows through the failed circuit. The level of current translates to 480 watts generated within the rectifier case. The 480-watt power output is 13 times greater than an average 37-watt soldering iron used in the electronics industry.

The failed semiconductors become high wattage heaters that are controlled by the hot silicon's resistance, overheating the path through the copper components, melting the plastic affixing the terminals, melting the epoxy fillers, and igniting any grease or oil on the wiring harness insulation. Furthermore, the leakage path does not conduct enough current to melt the 12 AWG fuse link. Therefore, there is only an appearance of safety when employing the fuse link. Once started, the meltdown continues until the battery is discharged or manually disconnected. Further, rectifiers that fail without a catastrophic failure are still a nuisance to the general public because of the required service calls, the towing, and the repair costs.

Figure 4A:
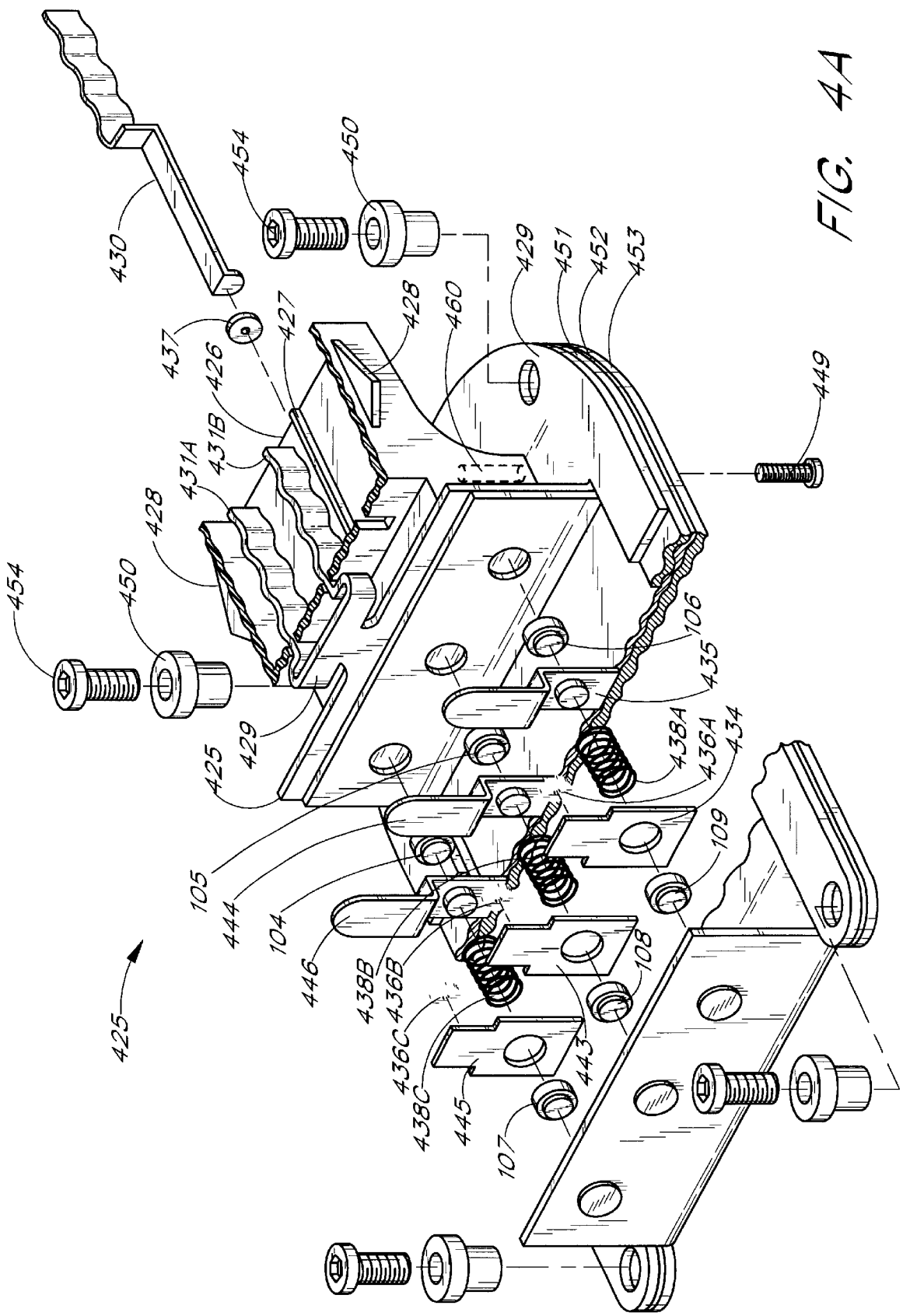
FIG. 4A illustrates a rectifier assembly with safety washers.

FIG. 1 illustrates a typical rectifier bridge configuration of an alternator circuit. The rectifier bridge circuit 100 is connected to the stator windings 101, 102, 103. The rectifier bridge circuit 100 is also connected to the negative terminal 112 of the battery 114. The rectifier bridge circuit 100 includes six diodes 104–109. A first set of diodes 104–106 is thermally and electrically coupled to a first heat-sink (FIG. 4A). A second set of diodes 107–109 is thermally and electrically coupled to a second heat-sink. The anodes of the first set of diodes 104–106 are connected to the cathodes of the second set of diodes 107–109, thereby forming three diode pairs 104/107, 105/108, 106/109 that are connected in series between the first heat-sink and the second heat-sink. Leads that extend from the alternator's stator windings 101, 102, 103 are electrically connected to the cathode/anode connections of the diode pairs 104/107, 105/108, 106/109. A lead 116 to the voltage regulator is connected between a diode pair 106/109. The lead 116 is also optionally connected to an electric choke (not shown) if an electric choke is used. Output terminals 115 from the first heat sink are coupled to the positive post 111 of the battery 114 by a fusible link 113. An output terminal 118 in FIG. 1 represents the connection from the second heat sink to the common ground when the alternator with the rectifier bridge circuit 100 is installed on an engine. The common ground is also connected to the negative post 112 of the battery 114 to complete the circuit from the rectifier bridge circuit 100 to the battery 114.

Figure 2:
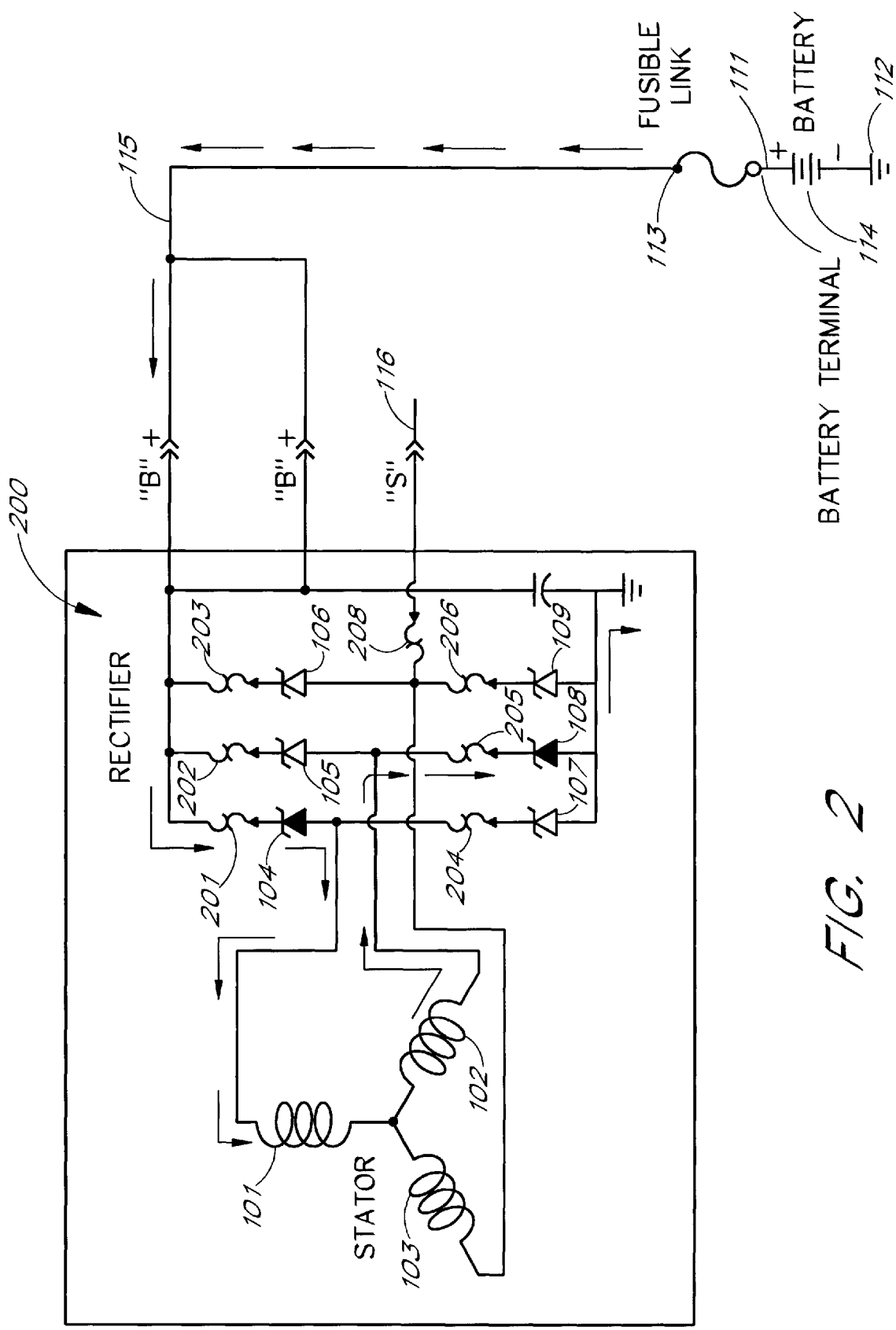
FIG. 2 illustrates a rectifier bridge alternator circuit with the thermal safety disconnects of the present invention.

FIG. 2 illustrates a rectifier bridge circuit 200 that includes thermal safety disconnect elements 201–206 (herein after "disconnect elements") in accordance with the present invention. The disconnect elements 201–206 are coupled along the potential circuit paths from the positive terminal 111 to the negative terminal 112 of the battery 114. The disconnect elements 201–206 are coupled in series with the circuit paths of the diodes 104–109, adjacent to each diode. The arrows along the circuit lines in FIG. 2 illustrate the direction of voltage drop when current flows through the failed diodes. For example, a first disconnect element 201 is in the circuit path associated with a first diode 104. The first disconnect element 201 is responsive to the heat dissipated from the first diode 104 such that the first disconnect opens the circuit path when the first diode overheats. Generally, the disconnect elements 201–206 are located in positions where the heat dissipated from the failed diodes 104–109 can best be sensed. A special disconnect element 208 is used to open the circuit associated with the lead 116 to the voltage regulator and to the electric choke.

A first diode 104 and a second diode 108 are highlighted to illustrate the current path from the positive terminal 111 through the two failed diodes, and the stator coils 101, 102, to the negative terminal 112. As may be appreciated, current from the stator assembly can flow in the reverse direction to the ground when a pair of diodes fail. During a failure of the two highlighted diodes 104, 108, the heat generated by the diodes, as a result of the excess current, melts the adjacent disconnect elements 201, 205 to open the circuit path of the diodes. The stator coils 101, 102, 103 along with the six diodes 104–109, and the "S" lead 116, provide twelve possible paths to ground.

Figure 3A:
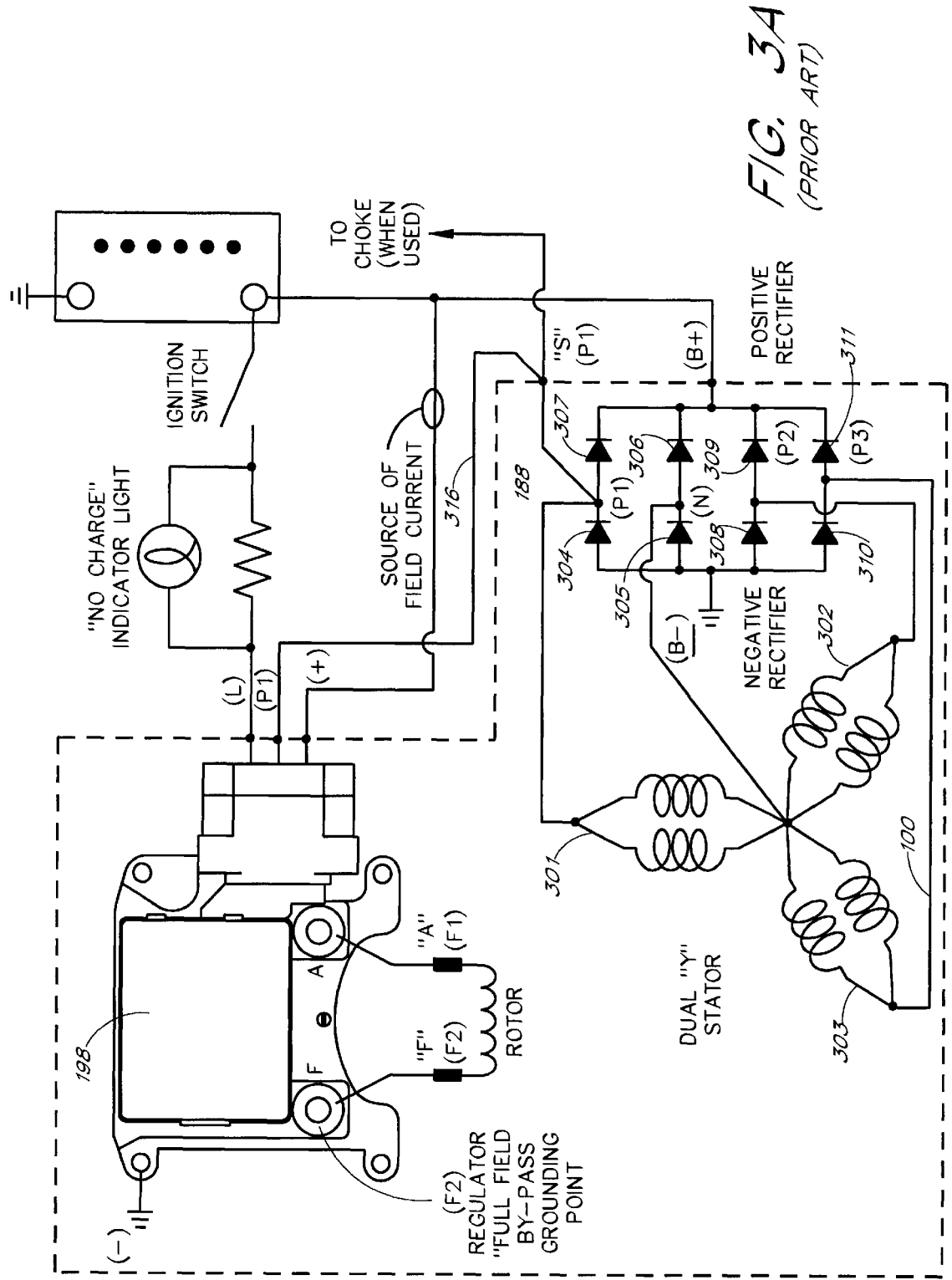
FIG. 3A illustrates a Ford 3G rectifier bridge.

FIG. 3A illustrates the circuit arrangement of a Ford 3G alternator. The rectifier circuit includes eight diodes 304–311 that form four diode pairs 304/307, 305/306, 308/309, and 310/311. The diode pairs 304/307, 305/306, 308/309, 310/311 are coupled to the stator coils 301–303 and to the battery terminals (not shown) in a similar manner as the diode pairs and stator coils of FIG. 1. The fourth diode pair 305/306 provides a connection from the center of the dual "Y" stator.

FIG. 3B illustrates the Ford 3G alternator circuit of FIG. 3A after undergoing modifications to include disconnect elements 336. The disconnect elements 336 are provided adjacent to each diode so as to control the flow of current through the associated diode. The disconnect elements 336 cut the flow of current in the associated circuit when the corresponding diode overheats.

As discussed below in connection with FIGS. 4A, 4B, and 5A, the disconnect elements used in the circuit of FIG. 2 and in the circuit of FIG. 3B are preferably safety spacer washers that have an inside diameter of approximately 0.06 inch, an outside diameter of approximately 0.22 inch, and a thickness of approximately 0.1 inch. Alternatively, the thickness is approximately 0.06 inch. The safety washers are advantageously made out of tin that has a negligible electrical resistance and that has a melting temperature of approximately 232 degrees centigrade. The dimensions of the safety washer may also vary with the location within the rectifier assembly.

FIG. 4A illustrates a rectifier assembly 425 with the disconnect elements of the present invention. The rectifier assembly 425 is preferably made of brass, or beryllium, that is bent, or is formed, to shape. The rectifier assembly 425 includes a connector assembly 429 which has two corrugated B+terminals 431A, 431B that are guided into a phenolic type housing 426. An alignment rail 427 aligns and polarizes the female connector (not shown) from the automobile wiring harness. When fully engaged, the locking ramps 428 secure the corrugated terminals 431A, 431B to the female connector. The corrugated terminals 431A, 431B are discussed in further detail below with reference to FIG. 18.

A third terminal 430, generally referred to as the "S" sensing terminal, is fitted with a safety washer 437. The "S"

terminal 430 fits into a third slot in the rectifier assembly 425. The "S" terminal 430 is coupled to a first set of semiconductors, 106, 109, via a pair of terminal brackets, 434/435. The "S" terminal 430 is formed in a corrugated configuration so as to increase its width and ensure proper connection with potentially worn out connectors. The safety washer 437 melts when overheated to disconnect the "S" sensing terminal. The safety washer 437 corresponds to the special disconnect 208 in FIG. 2.

The pair of terminal brackets 434/435, 443/444, 445/446 are coupled together by safety washers 436A, 436B, 436C. A first set of terminal brackets 434/435 is pressed against the diode contacts of a first pair of diodes 106/109 by an insulated compression spring 438A. The first set of terminal brackets 434/435 is held together by a safety washer 436A that is soldered to the terminal brackets. A second diode pair 105/108 is coupled to a second set of terminal brackets, 443/444 by a spring 438B and by a safety washer 136B. A third diode pair 104/107 is coupled to a third set of terminal brackets 445/446 by a spring 438C and by a safety washer 136C. Four hold-down screws 454, inserted through four nylon bushings 450, secure the rectifier assembly 425, the terminal plate 429, the positive heat sink 451, a gasket 452, and the negative heat sink 453 to the alternator body.

Figure 4B:
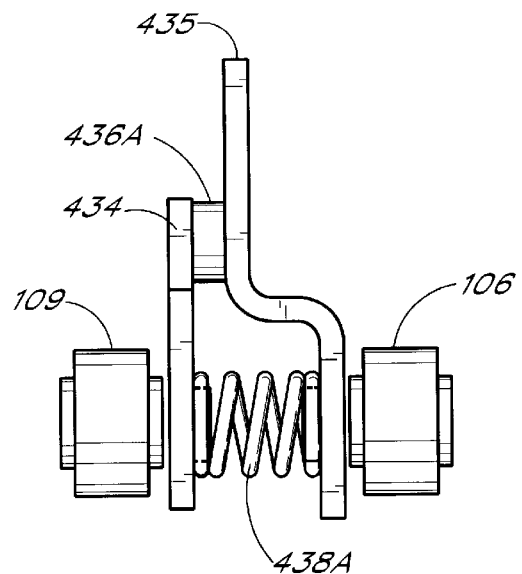
FIG. 4B illustrates a side view of a diode pair assembly with a thermal safety washer in place.

FIG. 4B is a side view of an arrangement of a diode pair assembly that is used in the rectifier assembly of FIG. 4A. The diode pair assembly includes the safety washer 436A, the insulated compression spring 438A, the pair of terminal brackets 434/435, and the pair of diodes 106/109. The spring is preferably a Teflon® coated compression spring. As discussed above, the safety washer 436A is soldered between the terminal brackets 434/435. The safety washer 436A provides a conductive path between the terminal brackets 434/435. The two other diode pair assemblies of the rectifier assembly of FIG. 4A are similarly arranged.

Figure 5A:
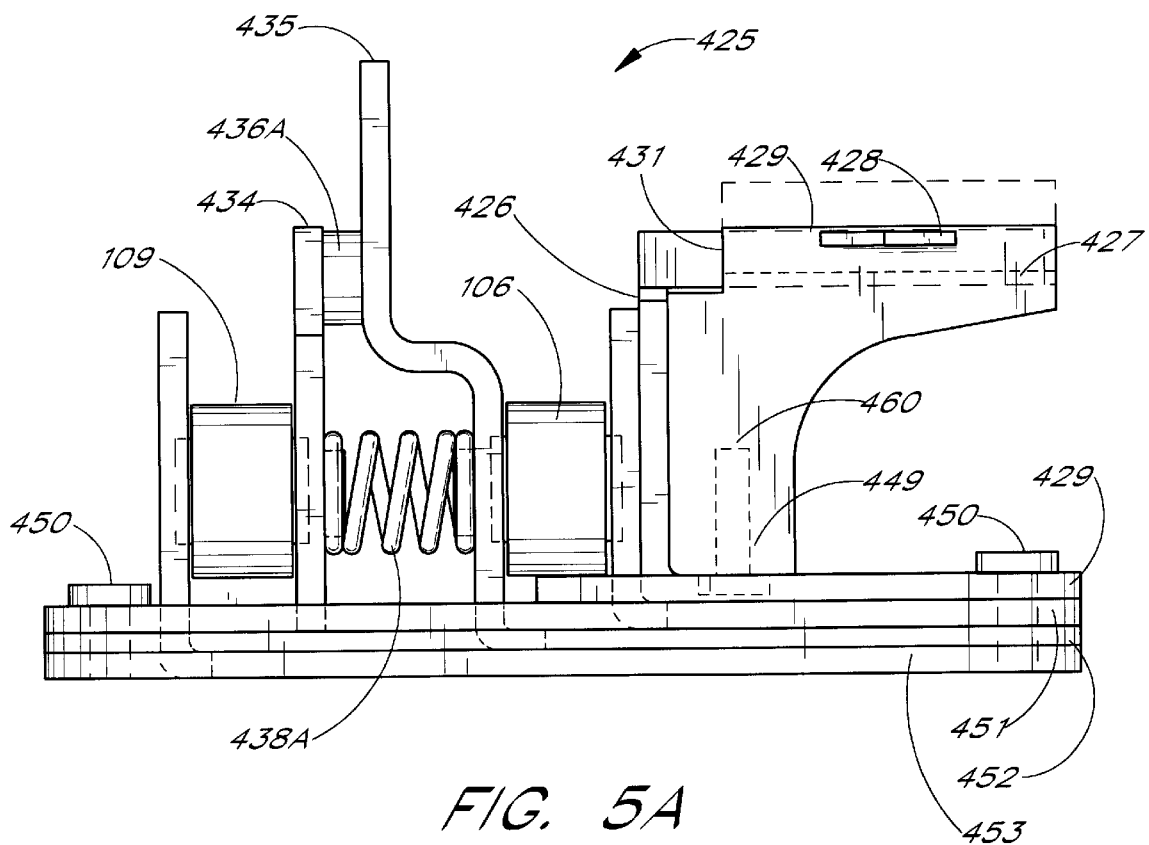
FIG. 5A illustrates a side view detail of the rectifier assembly of FIG. 4A.

FIG. 5A illustrates a side view of the rectifier assembly 425 of FIG. 4A. The rectifier assembly 425 includes the rectifier assembly components of FIG. 4A when assembled together.

In operation, the corresponding safety washer melts when a failed diode dissipates excessive heat. The melted safety washer opens the circuit path between the terminal brackets to disconnect the failed diode from its circuit paths. The terminal brackets are held apart by the compressed spring positioned between the terminal brackets.

Although tin safety washers are used in the illustrated apparatus, various types of melting materials can be used. Further, the melting material may be configured as washers, tabs, or other shapes that suit the particular apparatus. Although the illustrated embodiment uses insulated compression springs and melting material, which force the failed circuit to disconnect by disconnecting both the positive semiconductor and the negative semiconductor, a similar effect can be achieved by only disconnecting one semiconductor of a conducting pair to open the circuit to ground, for example.

Figure 5B:
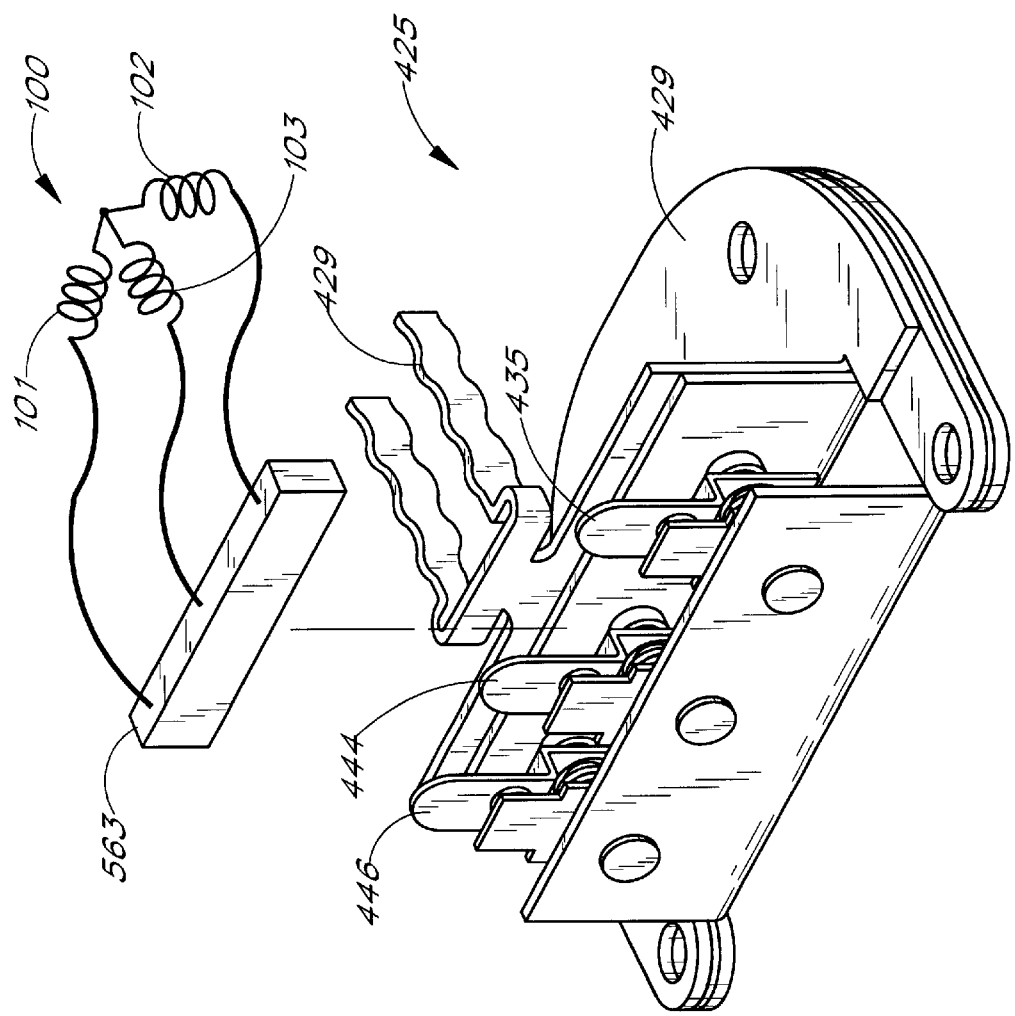
FIG. 5B illustrates a rectifier assembly and the stator field coil circuits.

FIG. 5B is a second perspective view of an assembled rectifier that includes the components of FIG. 4A. The two B+parallel terminals 429 are formed to receive the female connector from the automobile wiring harness. The stator coils 101, 102, 103 (shown pictorially) are coupled to the rectifier assembly 425 by a connector 563 that mates with the terminal brackets 446, 444, 435. Thus, the stator coils 101, 102, 103 are coupled to the bracket terminals 446, 444, 435 that provide the common connection points between the diodes in the diode pairs.

Figure 5C:
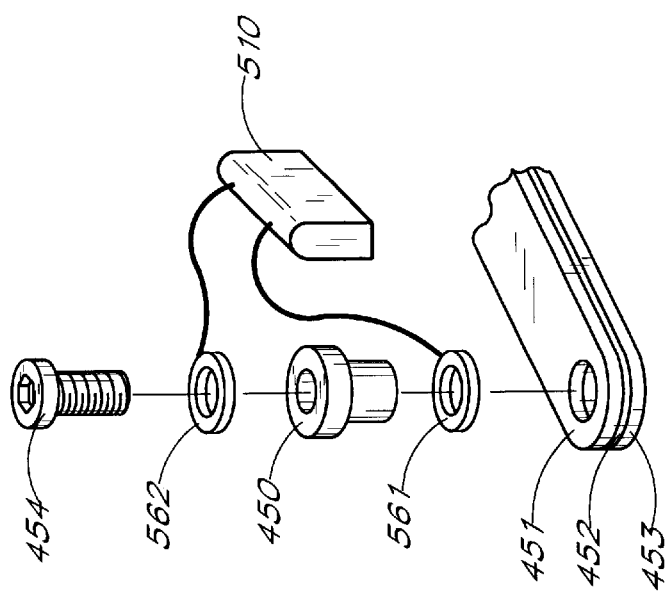
FIG. 5C illustrates the capacitor assembly of the rectifier circuit.

FIG. 5C illustrates the capacitor module of the rectifier assembly of FIG. 4A. A capacitor 510 is coupled to the positive heat sink 451 by a screw 454 and a nylon bushing 450. The capacitor 510 includes a first connector ring 561 and a second connector ring 562 to couple the capacitor between the positive terminal 111 and the negative terminal 112 of the battery, as is illustrated in FIG. 1.

Figure 6:
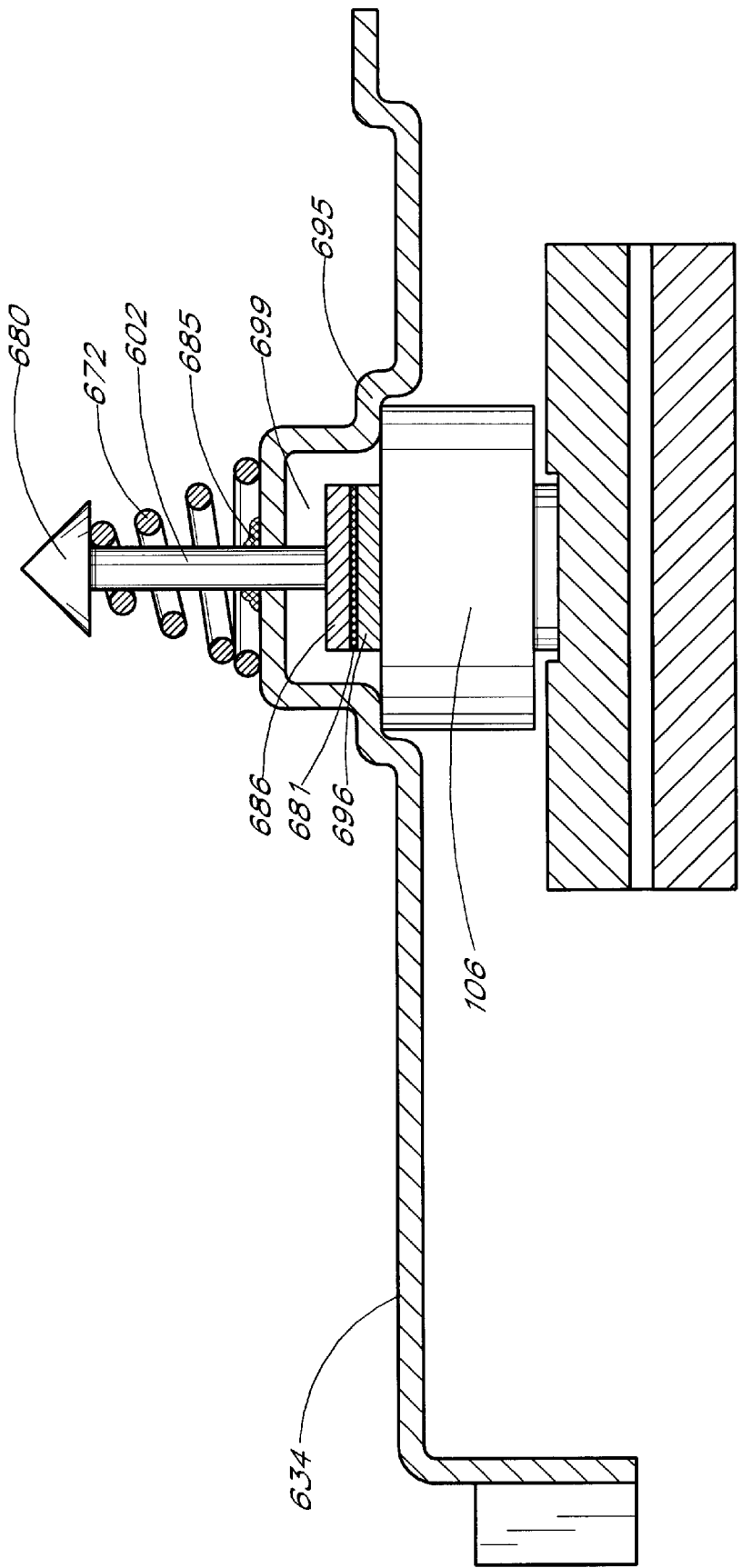
FIG. 6 illustrates details of a button-type semiconductor with a spring pull-off, contact safety release.

FIG. 6 illustrates a diode 106 with a spring pull-off thermal safety release. The apparatus utilizes terminals that include spring-loaded contacts, which disconnect when a diode overheats. A lead 602 has a first end that defines a nail head contact 686. The lead 602 extends through an opening in a circuit terminal 634. The circuit terminal 634 is adapted to rest on the diode 106 without touching the diode's electrical contact 696. As may be appreciated from FIG. 6, the terminal body 695 is thus insulated from the diode's electrical contact 696.

The nail head contact 686 is soldered to the diode's electrical contact 696 by a low melting point solder 681. The lead 602 is soldered to the terminal body 695 by using a higher melting point solder 685 than that which was used to couple the nail head contact 686 to the diode's electrical contact 696. A clearance 699 within the circuit terminal 634 allows for the release of the nail head contact 686 from the diode's electrical contact 696 when the solder 681 melts.

A second end 680 of the lead 602 is shaped into an arrow head. The second end 680 of the lead 602 extends from a small opening in a conical spring 672 such that the spring is compressed by the second end 680 of the lead 602.

In operation, the terminal assembly is used to open the circuit associated with a diode when the diode generates heat in excess of a threshold. The heat radiated by a failed diode 106 increases the temperature of the low melting point solder 681 between the nail head contact 686 and the diode's electrical contact 696. The increase in temperature causes the low melting point solder 681 to melt. Although, the higher melting point solder 685 remains solid, it only has sufficient mechanic strength to hold the lead 602 in place adjacent to the face of the spring 672 when the low melting point solder 681 is also solid. Thus, when the low melting point solder 681 melts in response to the high temperature, the pressure applied to the second end of the lead 602 by the spring 672 forces the nail head contact 686 away from the diode's electrical contact 696. The electrical connection between the lead 602 and the diode 106 is thereby opened. Further, the electrical connection between the diode 106 and the terminal 634 is also opened because the terminal is electrically connected to the diode only by the lead 602.

Figure 7A:
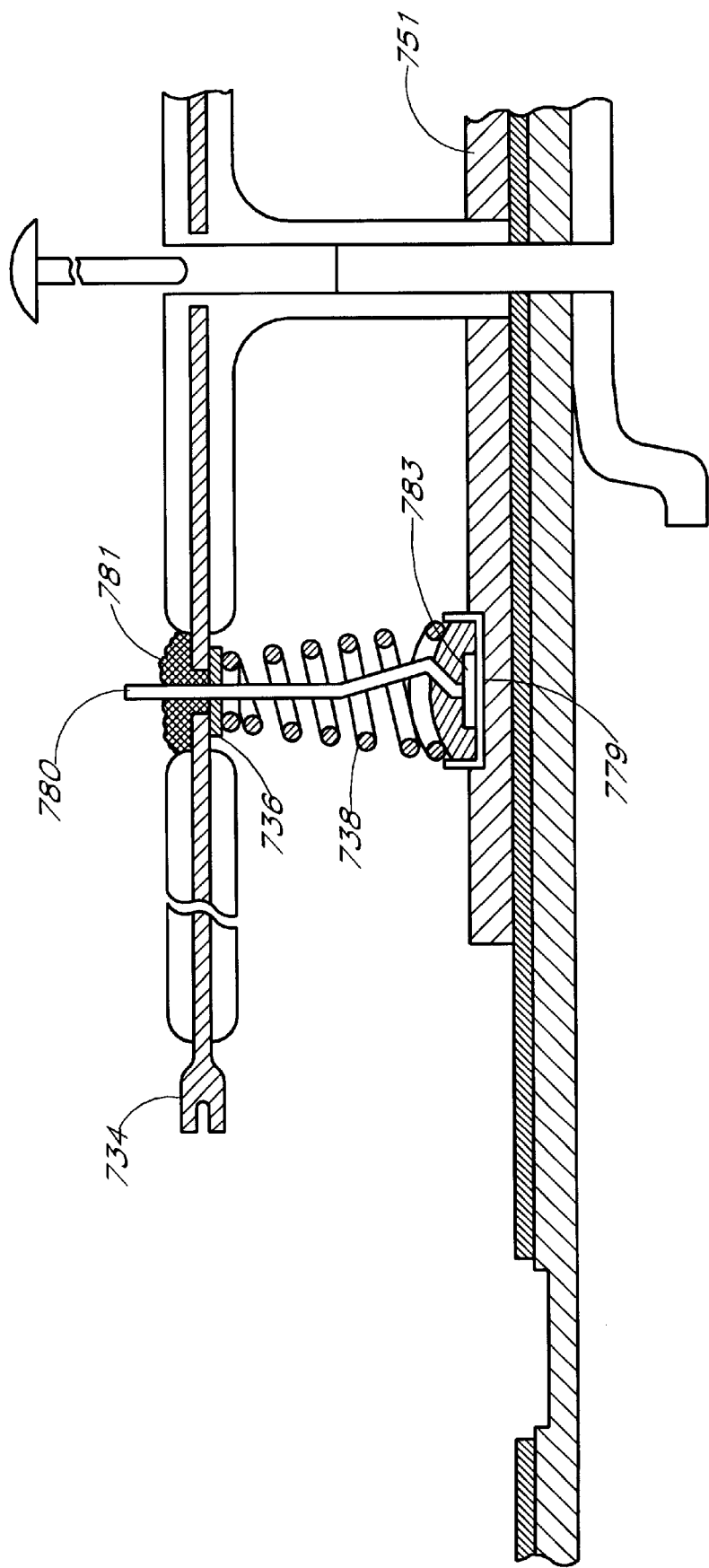
FIG. 7A illustrates a cross section of a pan type semiconductor assembly with safety washers.

FIG. 7A illustrates a pan-type semiconductor terminal assembly. The semiconductor diode 783 is nested in a cavity 779 of a heat sink 751. A safety washer 736 is pressed against a stator terminal 734 by a spring 738. A lead 780 extends from the diode's contact through the safety washer 736. Solder 781 is used to couple the lead 780 to the stator terminal 734 and to the safety washer 736.

FIG. 7B illustrates the terminal assembly of FIG. 7A after an overheated condition that causes a failure. When the semiconductor diode 783 overheats, the solder 781 and the safety washer 736 melt. The removal of the solder 781 opens the diode's electrical circuit because the diode 783 is electrically coupled to the stator terminal 734 by the solder and the spring 738 is electrically insulated.

Figure 7C:
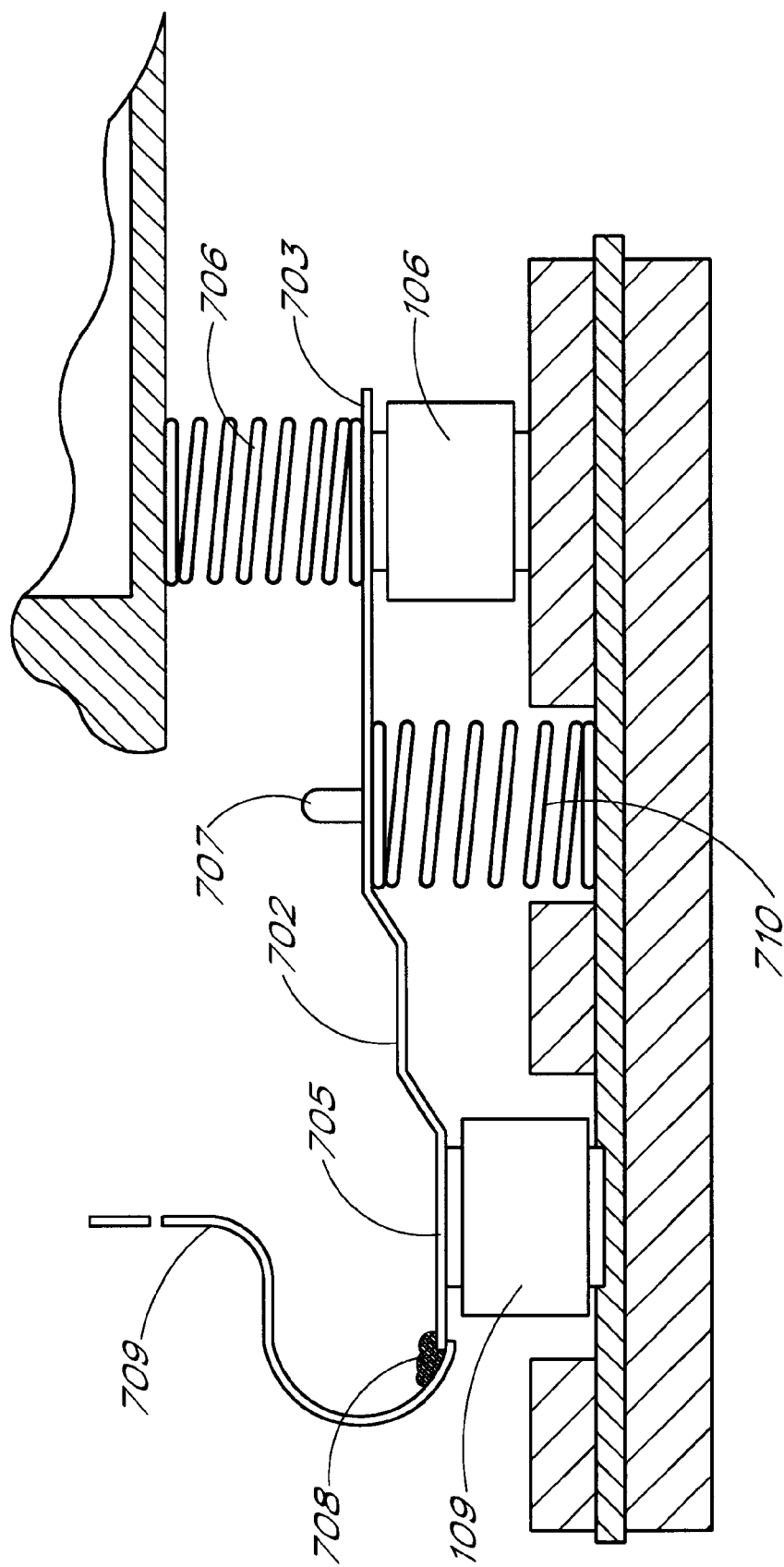
FIG. 7C illustrates an alternative embodiment of a diode pair assembly.

FIG. 7C illustrates a diode pair assembly which employs low melting point solder to open the overheated diode circuit. The diode pair assembly includes a first diode 106, a second diode 109, a terminal bracket 702, a first insulated compression spring 706, and a second insulated compression spring 710. The first diode 106 is located within a cavity in the base of the diode pair assembly. The first diode 106 is mechanically held against the base of the diode pair assembly by a first portion 703 of a terminal bracket 702. The first portion 703 of the terminal bracket 702 is positioned over the first diode 106. The first portion 703 of the terminal bracket 702 is forced downward towards the first diode 106 by the first compression spring 706. The first compression spring 706 is positioned between the terminal bracket 702 and the bottom portion of the connector locking ramp 428 (FIG. 4). The second diode 109 is positioned below a second portion 705 of the terminal bracket 702. The second portion 705 of the terminal bracket 702 is held in place on top of the second diode 109 by a low melting point solder 708. The low melting point solder 708 mechanically and electrically connects the second portion 705 of the terminal bracket 702 to a stator terminal 709. A second compression spring 710 is positioned below the center portion of the terminal bracket 702. The second compression spring 710 is secured by a pin 707. The pin 707 extends through an opening in the terminal bracket 702 and an opening in the heat sink.

In operation, when a diode fails and overheats, the low melting point solder 708 melts to disconnect the second portion 705 of the terminal bracket 702 from the stator terminal 709. The second compression spring 710 forces the second portion 705 of the terminal bracket 702 away from the stator terminal 709. Thus, the electrical circuit between the first diode 106, the second diode 109, and the stator terminal 709 is opened.

Figure 8A:
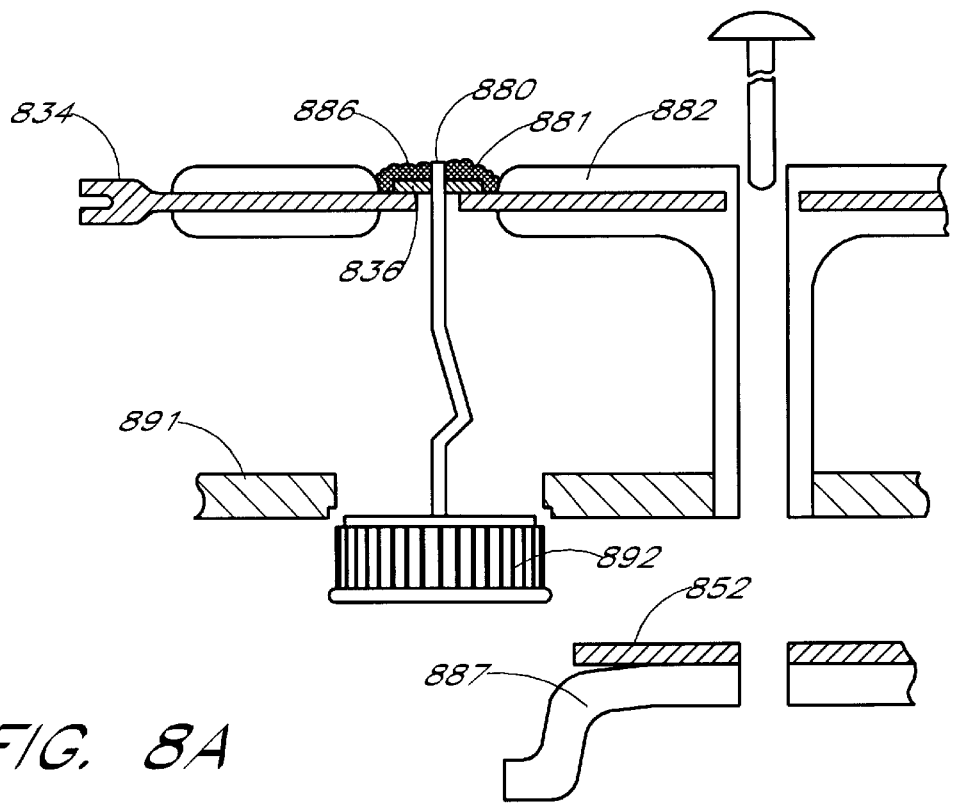
FIG. 8A illustrates a semiconductor prior to being pressed into a heat sink.

FIG. 8A illustrates a semiconductor diode 892 prior to being pressed into a heat sink 891. A lead 880 from the diode 892 extends through a safety washer 836. The lead 880 is coupled to the safety washer 836 by a low melting point solder 881. The solder 881 and the washer 836, provide an electrical connection between the diode 892 and the stator terminal 834, which is opened when the rectifier assembly overheats.

Figure 8B:
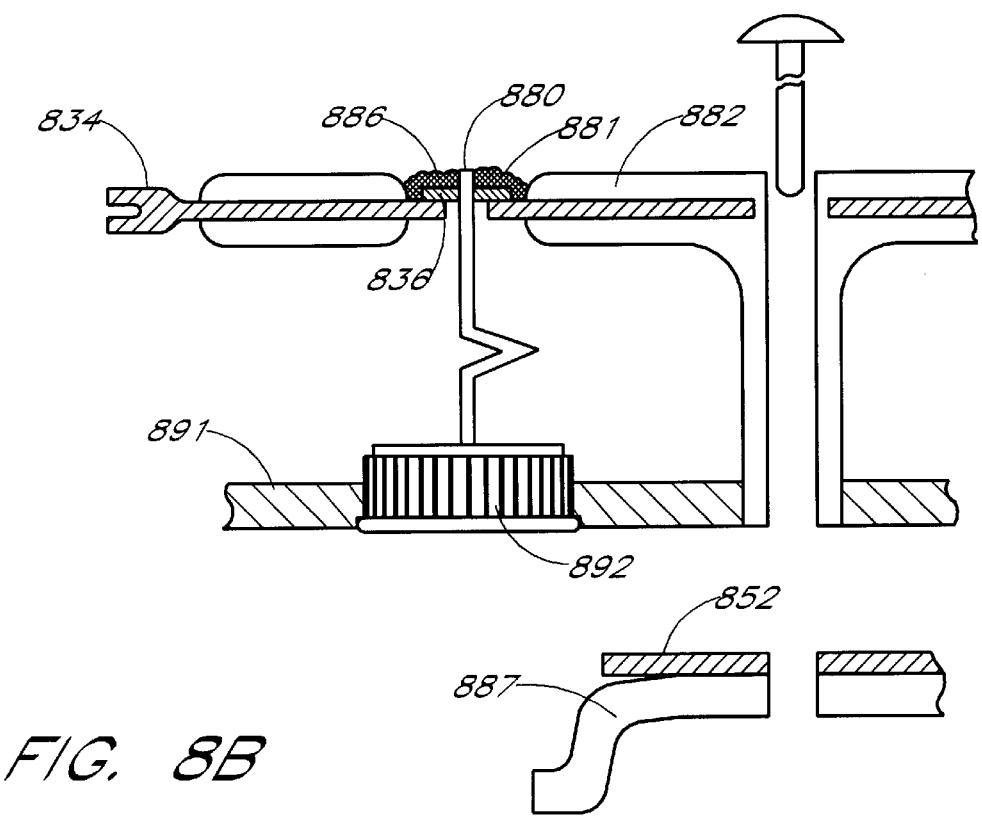
FIG. 8B illustrates the semiconductor of FIG. 8A after being pressed into the heat sink.

FIG. 8B illustrates the semiconductor diode 892 as installed in the heat sink 891. As may be appreciated from FIG. 8B, when installed the lead 880 is soldered in place, and is under compression.

Figure 8C:
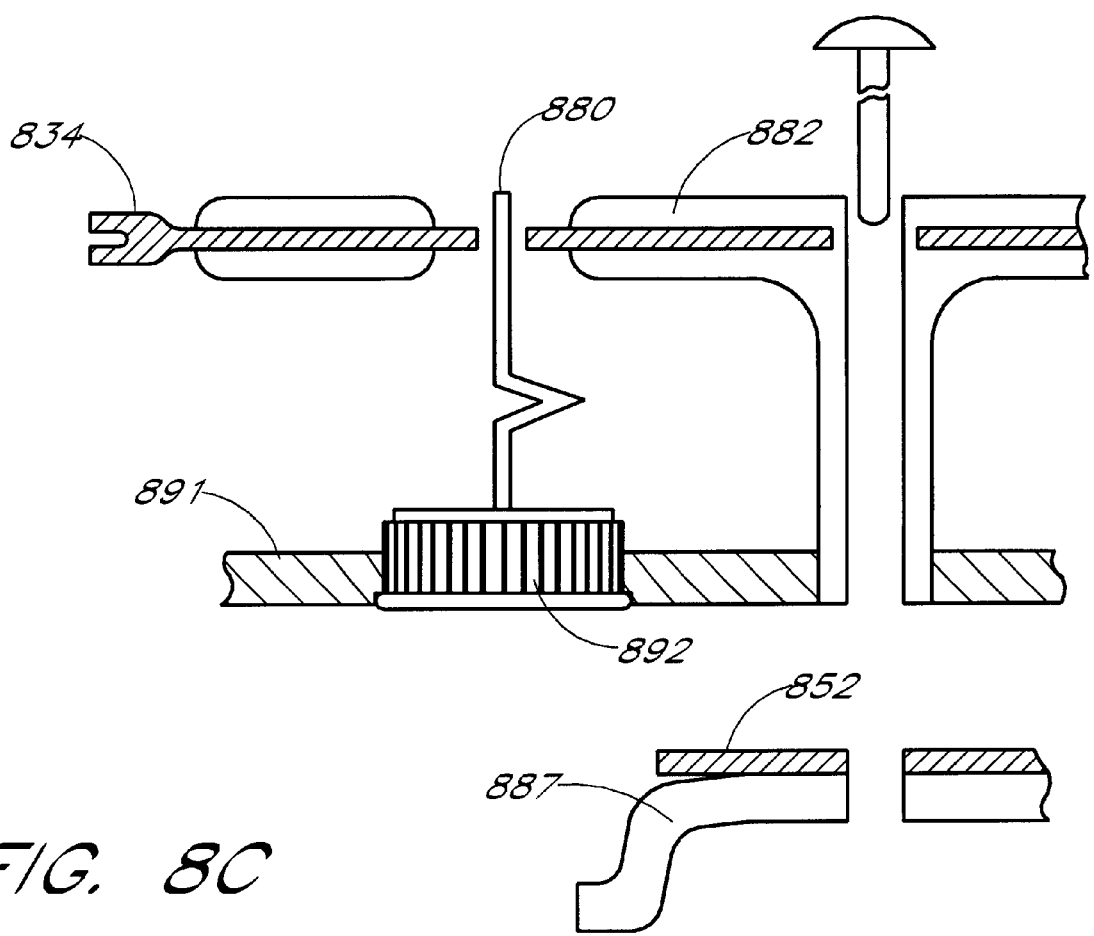
FIG. 8C illustrates the semiconductor assembly of FIG. 8B after a thermal failure condition.

FIG. 8C illustrates the semiconductor diode 892 after an overheat condition. When the diode 892 overheats, the solder 881 and the safety washer 836 melt. The cleared solder 881 creates a gap between the lead 880 and the stator terminal 834 to open the circuit connection from the diode to the stator terminal 834. Thus, the arrangement of FIGS. 8A, 8B, and 8C eliminates the use of the spring underneath the washer in the arrangement of FIGS. 7A, and 7B.

As discussed below in connection with FIG. 9 and FIG. 10, in another embodiment, a copper cup press fit semiconductor diode is coupled to a protective cup by a tin/copper type low resistance, low melting temperature, metal spacer disc that is soldered to the semiconductor contact surface. When the semiconductor fails and becomes an electrical heater instead of a switching and blocking device, the spacer disc melts and opens the circuit. A collection area within the copper cup provides room for the melted metal to clear the diode contact surface.

Figure 9:
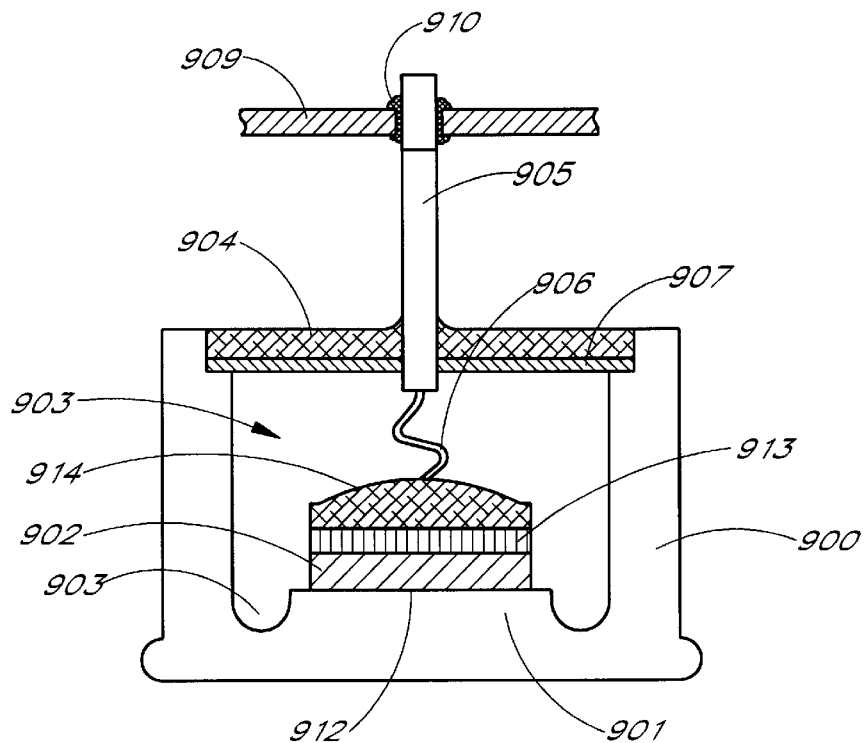
FIG. 9 illustrates a rectifier press-fit semiconductor diode assembly.

FIG. 9 illustrates a rectifier press fit semiconductor diode assembly with thermal disconnect. A silicon semiconductor chip 902 is coupled to a platform 912 in the bottom of the cup 900. A thermal safety disc 913 is coupled to the electrical contact of the chip 902. The lower end 906 of an axial lead 905 is coupled to the thermal safety disc 913 via solder 914. The upper end of the axial lead 905 extends up through an insulator 907, which is then sealed with epoxy 904. The upper end of the axial lead 905 is affixed to the rectifier bridge circuit terminal 909 by solder 910.

Figure 10:
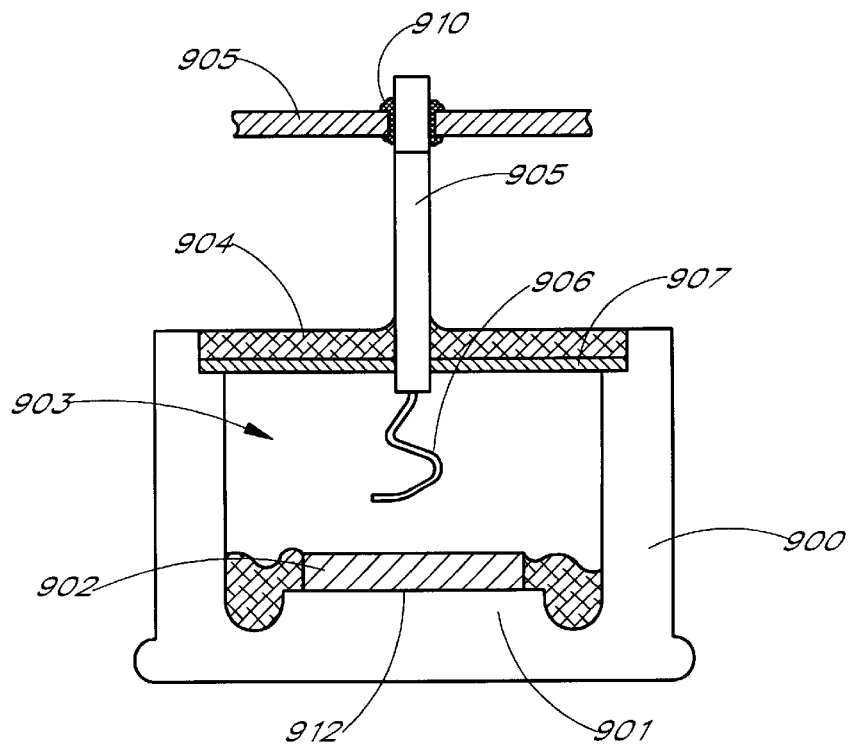
FIG. 10 illustrates the diode assembly of FIG. 9 after a thermal failure condition.

FIG. 10 illustrates the diode assembly of FIG. 9 after the thermal safety disc 936 has melted away from the semiconductor, leaving an open circuit between the semiconductor 902 and the lower end of the axial lead 906. A collection area 903 allows the melted disc 913 and solder 914 to flow away from the semiconductor contact area.

Figure 11:
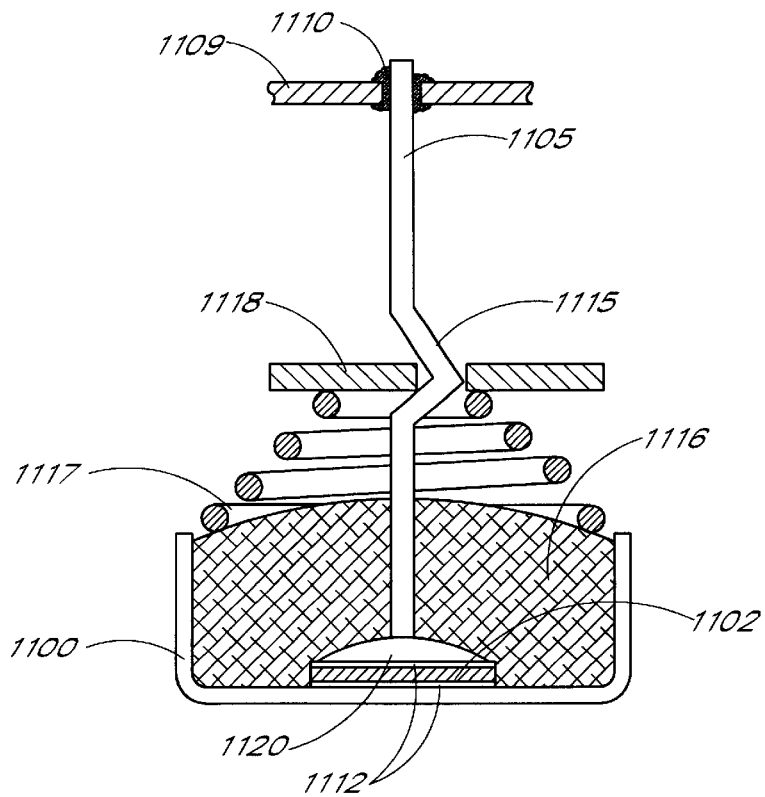
FIG. 11 illustrates a spring loaded semiconductor diode assembly.
Figure 12:
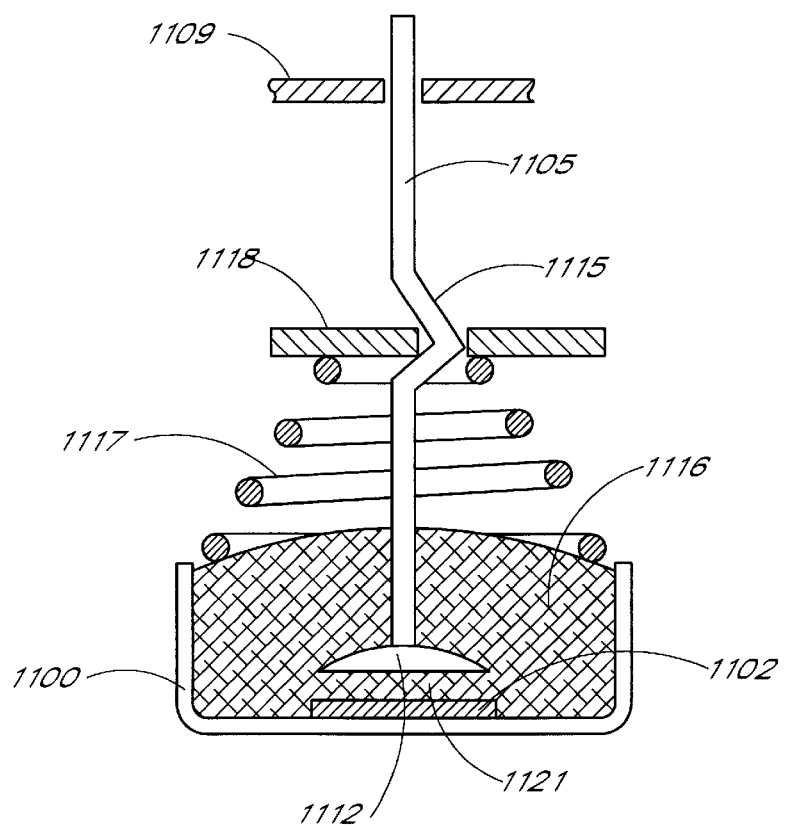
FIG. 12 illustrates the diode assembly of FIG. 11 after a thermal failure condition.

In another embodiment, shown in FIG. 11 and in FIG. 12, a conical compressed spring is affixed to an axial lead. The opposite end of the spring is compressed against the insulating material of the pan cup. The spring is preloaded so as to pull the semiconductor contact away when the solder melts. This action stops the current flow through the semiconductor circuit. Prior to opening the circuit, the generated heat conducts up along the axial lead from the semiconductor to melt the soldered lead of the rectifier bridge terminal. This allows the lead to be forced upwards, to open the semiconductor circuit.

FIG. 11 illustrates a pan-type diode assembly, which includes a semiconductor 1102 affixed to the inside of a copper pan 1100 by solder 1112. The nail head 1120 of the axial lead 1105 is affixed to the semiconductor 1102 by solder 1112. The axial lead 1105 terminates at the rectifier bridge terminal 1109 and is soldered using a lower melting temperature solder 1110. A locking clip 1118 is used to lock a compression spring 1117 to a bend 1115 in the axial lead 1105.

FIG. 12 illustrates the pan type rectifier diode assembly of FIG. 11 in a failed, overheated condition. Excessive heat from the reverse current flow causes the solder 1112 to melt at the connection point between the nail head 1120 and the semiconductor 1102. The heat also melts the solder 1110 at the opposite end of the lead 1105 to allow the compression spring 1117 to push the axial lead 1105 up through the terminal 1109. The nail head 1120 is thus allowed to lift off the semiconductor 1102 and open the circuit between the semiconductor and the axial lead 1105. Once the circuit is opened, the current flow is stopped. The compression spring 1117 pushes the clip 1118 upward at the stress relief bend 1115 of the axial lead 1105 and pushes the potting material 1116 upward to open the internal circuit of the cup assembly.

Figure 13A:
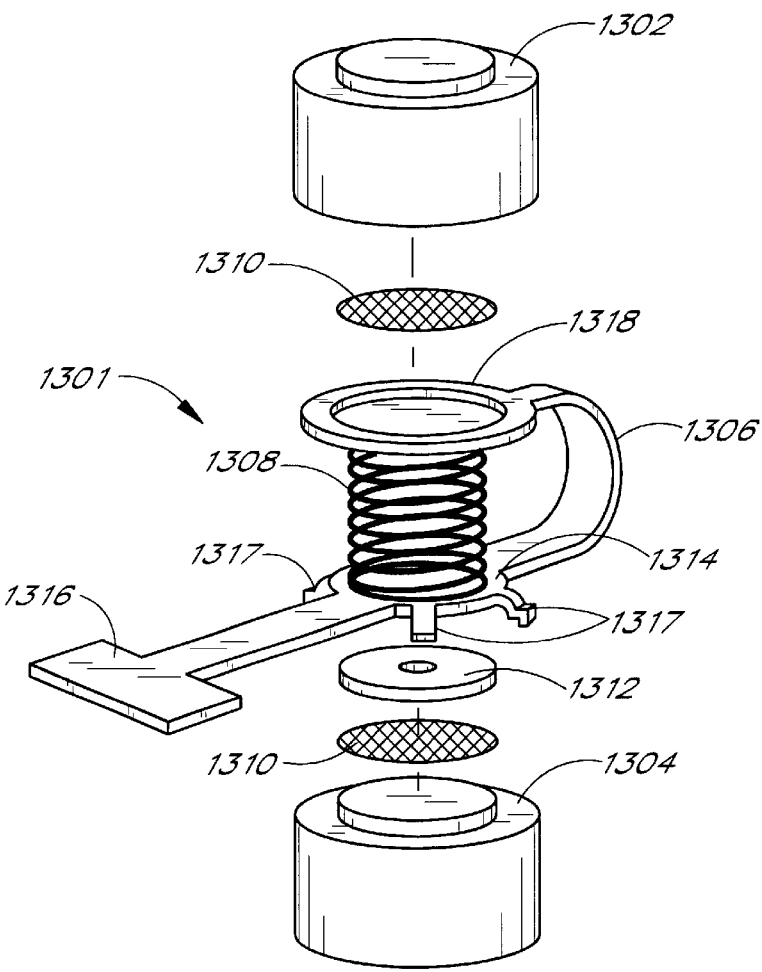
FIG. 13A illustrates an exploded view of an alternative embodiment of a diode pair safety connector assembly.
Figure 13B:
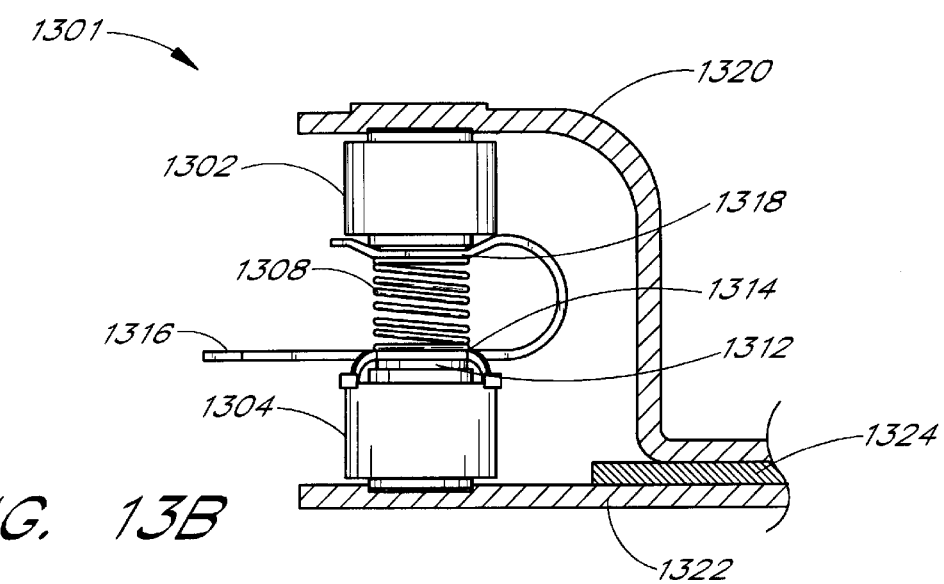
FIG. 13B is a side view illustration of the completed assembly of FIG. 13A.

FIG. 13A illustrates an alternate embodiment of a diode pair assembly 1301 employing safety washers. The diode pair assembly 1301 includes a first diode 1302, a second diode 1304, a terminal connector 1306, a spring 1308, and a safety washer 1312. The first diode 1302 is coupled to the positive terminal of the diode pair assembly 1301 and to a first portion 1318 of the terminal connector 1306. A second portion 1314 of the terminal connector 1306 is coupled to the second diode 1304. The terminal connector 1306 rests on the second diode 1304 by using a plurality of standoffs 1317 that maintain the diode's electrical contact spaced apart from the second portion 1314 of the terminal connector. A safety washer 1312 is positioned below the spaced apart terminal connector 1306. The spring 1308 is placed between the portions 1314, 1318 of the terminal connector 1306 to maintain the portions of the terminal connector spaced apart from one another. A circuit terminal 1316 is formed at an end of the terminal connector 1306. Solder 1310 is used to connect the diodes 1302, 1304 to the safety washer 1312 and to the terminal connector 1306. FIG. 13B illustrates the components of the diode pair assembly 1301 when assembled together between a positive heat sink 1320 and a negative heat sink 1322. An insulating gasket 1324 separates the positive heat sink 1320 and the negative heat sink 1322.

In operation, the diode pair assembly disconnects the electrical connection between the diodes 1302, 1304 when the level of heat absorbed by the safety washer 1312 melts the safety washer. The safety washer 1312 facilitates the electrical connection between the second diode 1304 and the terminal connector 1306. Thus, when the washer 1312 melts, the electrical connection between the diode 1304 and the terminal connector is eliminated. The electrical connection between the diode 1304 and any other component of the diode pair is also eliminated. Therefore, the diode pair assembly 1302 provides a thermally safe connection between two diodes.

Figure 14:
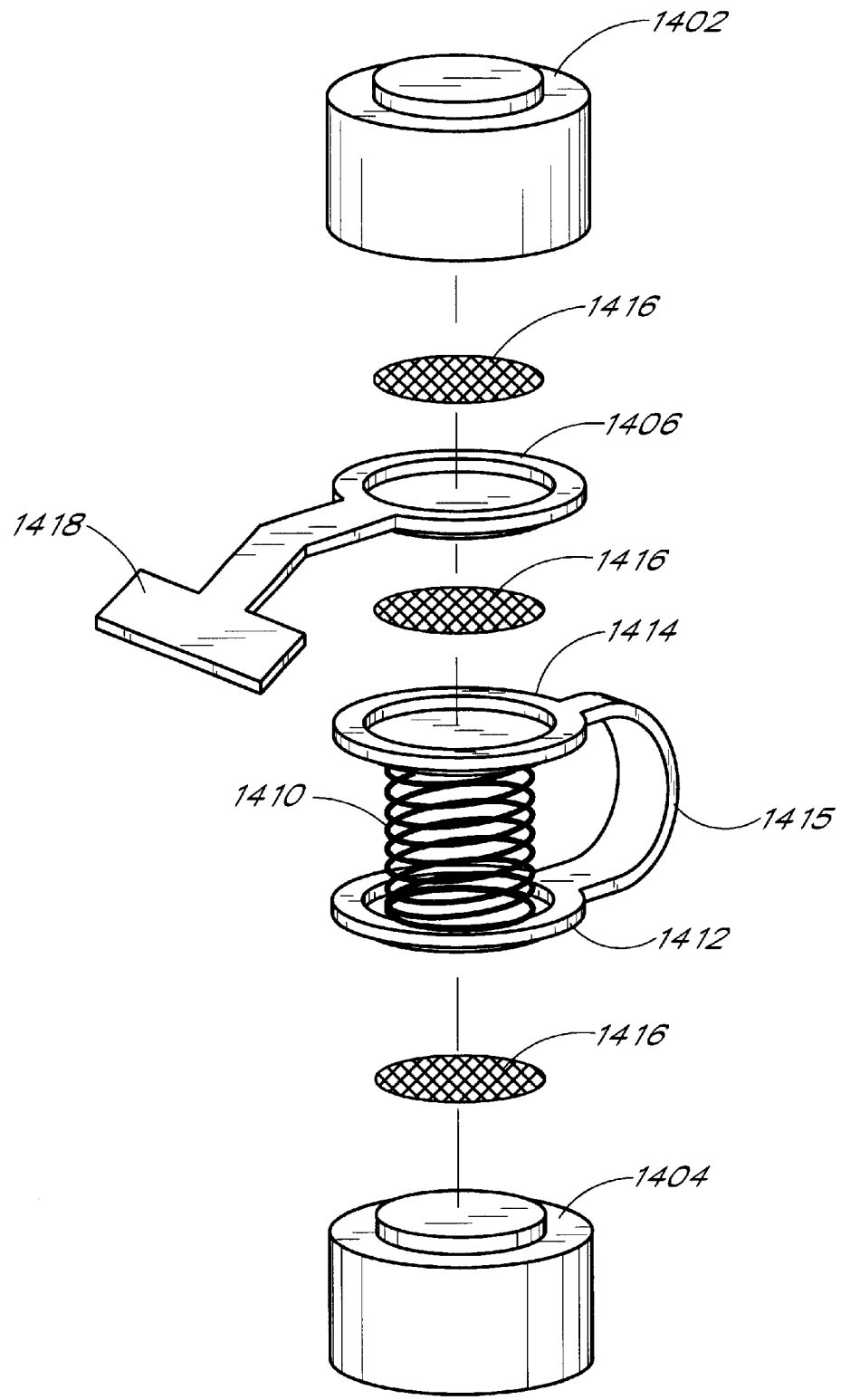
FIG. 14 illustrates an expanded view of an alternate embodiment of a diode pair safety connector assembly.

FIG. 14 illustrates a diode pair assembly 1401 that employs a meltable terminal connector. The embodiment of FIG. 14 eliminates the safety washer from the assembly of FIGS. 13A and 13B. The diode assembly includes a first diode 1402, a second diode 1404, a circuit terminal 1406, a connector terminal 1415, and an optional insulated spring 1410. The first diode 1402 is coupled to the circuit terminal 1406 and to a first end 1414 of the terminal connector 1415 by solder 1416. The second end 1412 of the terminal connector 1415 is coupled to the second diode 1404 by solder 1416. An optional spring 1410 may be provided between the ends 1412, 1414 of the terminal connector 1415 to separate the diodes 1402, 1404 from one another when the terminal connector melts away. In operation, when the diodes 1402, 1404 overheat, the terminal connector 1415 melts so as to disconnect the circuit path between the diodes.

Figure 15:
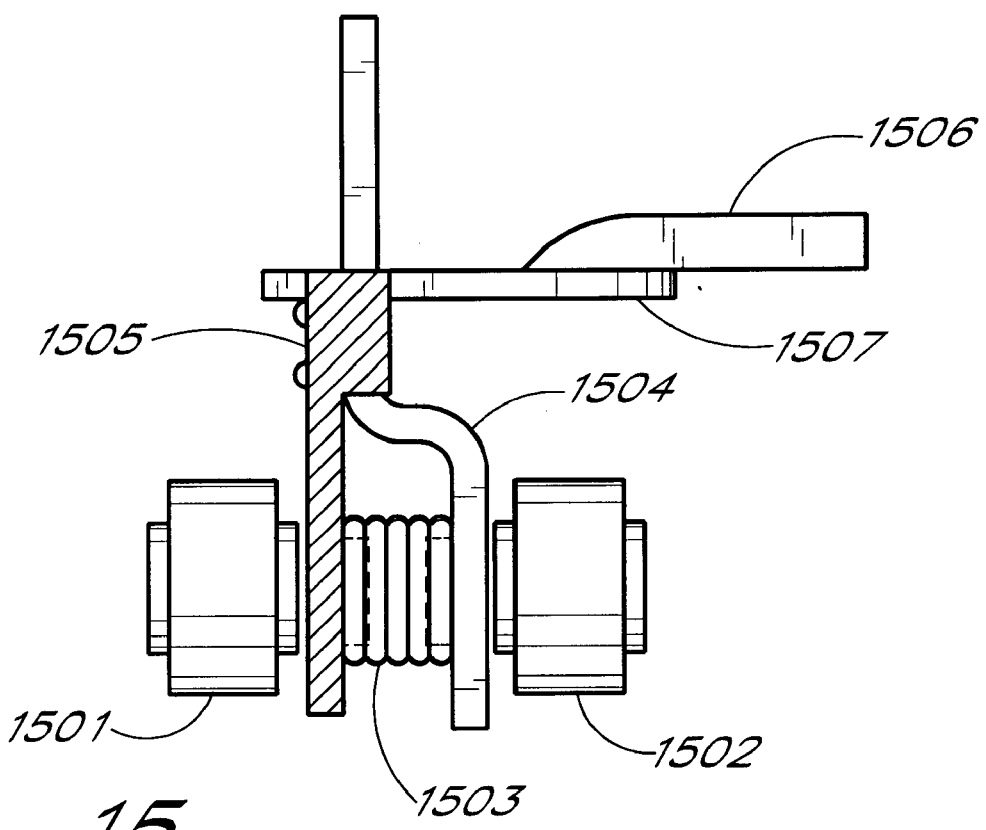
FIG. 15 illustrates a connection of diode pairs by a safety bracket.

FIG. 15 illustrates another embodiment of the safety disconnects of the present invention. The diodes 1501,1502 are coupled together by an L-shaped bracket 1504 and a low melting point connection plate 1505. The L-shaped bracket 1504 is soldered to the connection plate 1505 to secure a compressed spring 1503 between the diode pair 1501/1502. The circuit path of the diode pair 1501/1502 flows through the connection plate 1505. When a diode overheats, the connection plate 1505 melts to open the connection. The spring pushes the diodes 1501, 1502 away from one another. The use of a melting connection plate 1505 advantageously eliminates the safety washers from the rectifier assembly.

Figure 16:
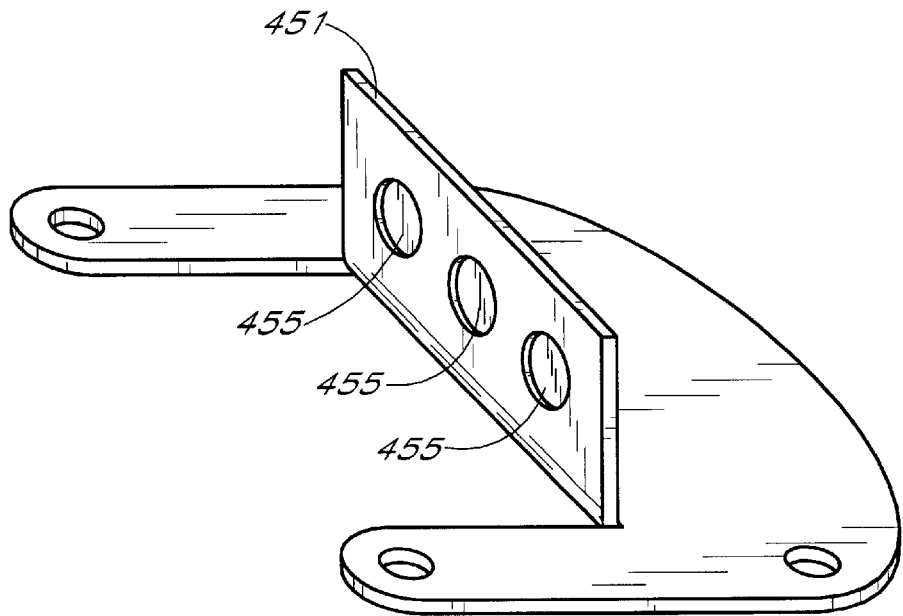
FIG. 16 illustrates the positive heat sink of FIGS. 4A and 5A.

FIG. 16 illustrates the positive heat-sink 451 of FIGS. 4A and 5A. The positive heat sink 451 includes a vertical bent portion and a horizontal base portion. The vertical bent portion includes cavities 455 for securing the diodes of the rectifier assembly 425 in position.

Figure 17:
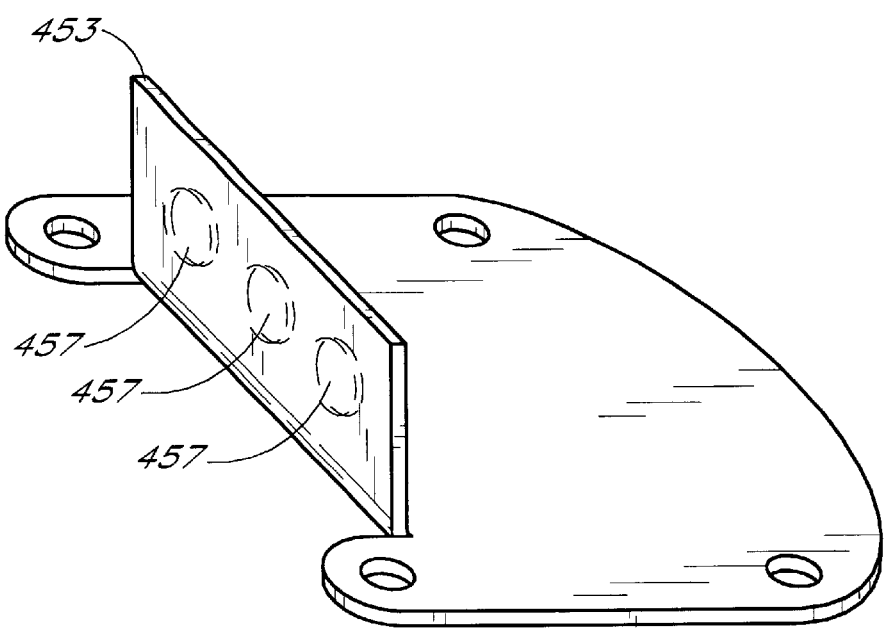
FIG. 17 illustrates the negative heat sink of FIGS. 4A and 5A.

FIG. 17 illustrates the negative heat sink 453 of FIGS. 4A and 5A. The negative heat sink 453 includes a vertical bent portion and a horizontal base portion. The horizontal base portion in intended to serve as the bottom element in the rectifier assembly configuration that is illustrated in FIG. 4A. As may be appreciated, the elements that are stacked on the negative heat sink 453 to form the rectifier assembly body include, in order, the gasket 452, the positive heat sink 451, and the terminal connector assembly 429. The vertical bent portion of the negative heat sink 453 includes cavities 457 for securing the diodes of the rectifier assembly 425 in position.

Figure 18:
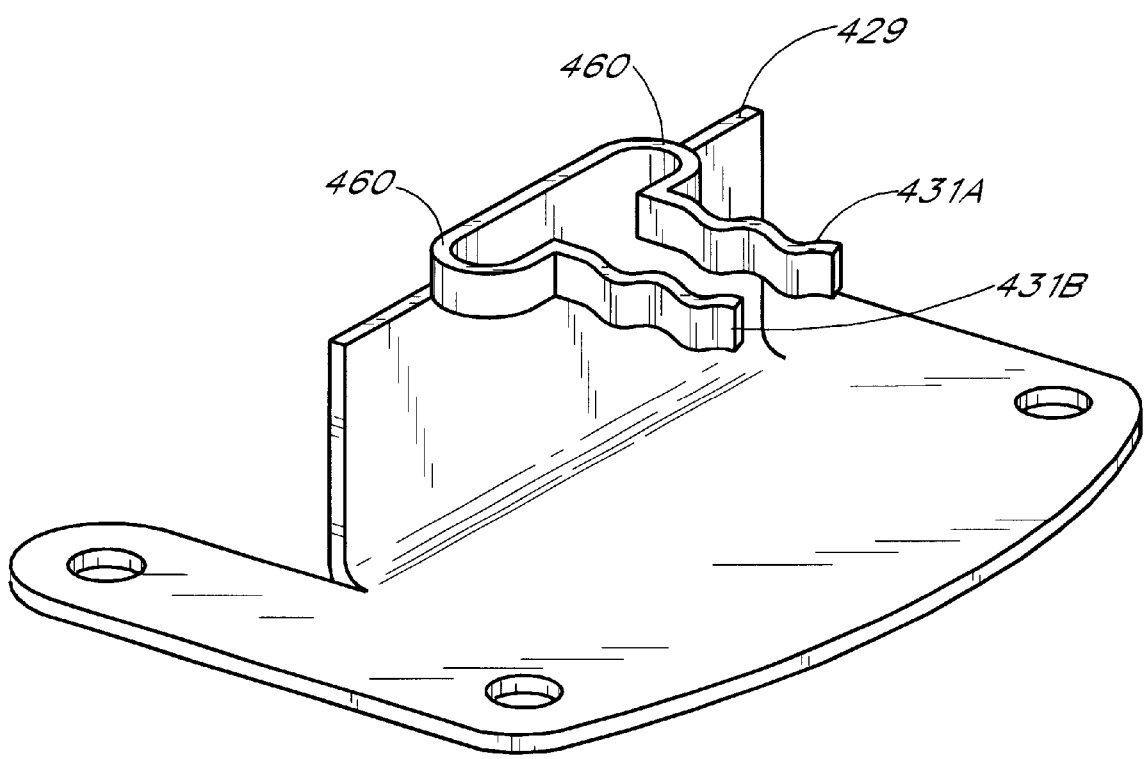
FIG. 18 illustrates an alignment rail that ensures proper mating with the female connector from the automobile wiring harness.

FIG. 18 illustrates the terminal connector 429 of FIGS. 4A and 5A. The terminal connector 429 is used to couple the female wiring harness to the rectifier assembly as illustrated in FIG. 4A. The terminal connector incorporates self-aligning corrugated terminal blades 431A, 431B that are formed with a plurality of bends to allow for a variation in the lateral spacing in a female connector. An additional large bend 460 at the base of each blade 431A, 431B provides additional flexibility with respect to the positions of the two blades. For example, a worn-out female harness may be spaced wider than a new female harness. The terminal connector 429 can mate with such a worn-out connector because of the effective thicknesses of the blades provided by the corrugation and because the bends 460 at the base of the blades allow the blades to adapt to different positions of the mating connectors.

The connector material is a tempered half-hard beryllium, approximately 0.031 inches thick. The connector 429 conducts the required current without overheating. The connector's temper allows it to spring back into any usable position to accommodate all connectors used in the alternator application. The corrugated terminal blades 431A, 431B include a plurality of detents or alternating dimples, approximately 0.125 inch from centerline to centerline, which expands the connector's contact gripping thickness from 0.031 inches to approximately 0.037 inches.

In use, the female connector is pushed into the terminal connector 429 to secure the corrugated blades 431A, 431B to grooves in the female connector. The corrugated blades 431A, 431B are thick enough so as to securely reside within the grooves of the female connector. The female connector is further held in place by a pair of detents on the terminal cover as discussed with reference to FIG. 4A. Thus, the irregularly shaped male blades allow for the terminal 429 to properly couple to a female connector after the connector has been removed from an original rectifier and may have become distorted or worn-out. The terminal connector 429 of the present invention does not increase the likelihood that the connector will fail.

Figure 19:
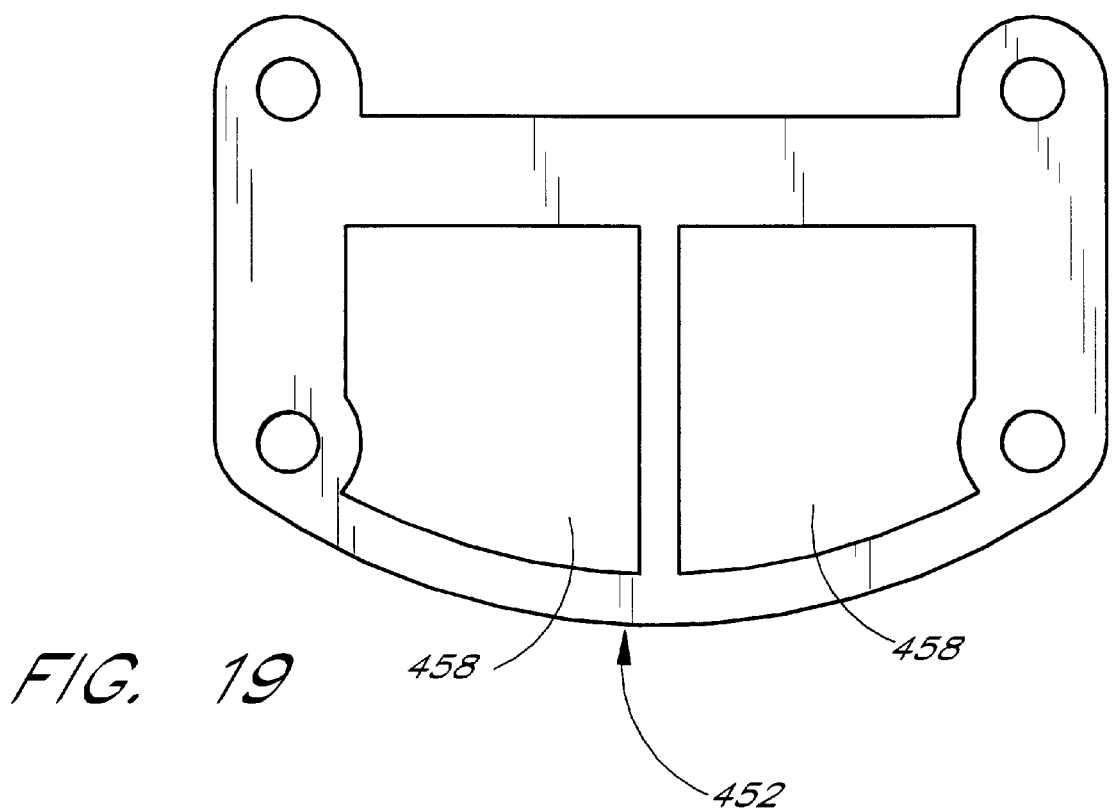
FIG. 19 illustrates the insulating gasket of FIGS. 4A and 5A.

FIG. 19 illustrates an insulating gasket 452 that is used in the rectifier of the present invention. The insulator gasket 452 is stamped out of a fiberglass reinforced, phenolic-type material, which is approximately 0.012 inches thick and has a compression strength of 65,000 psi (pounds per square inch). The gasket 452 separates the two copper heat sinks 451, 453, from one another. The inside area of the gasket 452 is stamped out to form two openings 458. During assembly of the rectifier, the openings 458 in the gasket 452 are filled with a thermally conductive (i.e., heat transferring), electrically non-conductive grease to enhance the transfer of a portion of the generated heat to the alternator housing.

Although the invention has been described in terms of certain preferred embodiments, other embodiments that are apparent to those of ordinary skill in the art, including embodiments which do not provide all of the features and advantages set forth herein, are also within the scope of this invention. Accordingly, the scope of the invention is defined by the claims that follow.

What is claimed is:

1. A rectifier assembly adapted to mount to the housing of a multi-phase alternating current generator so as to rectify AC current produced by the alternator into DC current, the rectifier assembly comprising:
   a positive heat sink;
   a negative heat sink;
   an insulating gasket separating the two heat sinks; stator terminals isolated from the heat sinks, each terminal connectable to a respective stator winding of said alternator;
   a plurality of semiconductor pairs, each semiconductor pair comprising a first semiconductor and a second semiconductor, each semiconductor having an anode and a cathode, one semiconductor of each pair having its anode connected to the negative heat sink and having its cathode connected to an anode of the other semiconductor of the pair, the other semiconductor of the pair having its cathode connected to said positive heat sink; and a plurality of safety washers electrically interposed in the semiconductor circuit paths, at least one of said safety washers thermally melting when overheated to open a respective one of said circuit paths.

2. The rectifier of claim 1, further comprising a plurality of insulated compression springs positioned between said safety washers and said semiconductors to apply pressure to said safety washers.

3. The rectifier of claim 1, wherein said semiconductors are power diodes.

4. A semiconductor assembly comprising:

a semiconductor; and at least one safety washer electrically interposed in the circuit path of the semiconductor, the safety washer positioned proximate to the semiconductor to receive the heat generated by the semiconductor when a junction fails, said safety washer melting in response to said heat and opening said circuit path.

5. A thermal disconnect for an automotive alternator rectifier assembly, comprising:

a first element electrically coupled to a contact of a first diode of the rectifier assembly;

a second element electrically coupled to a contact of a second diode of the rectifier assembly, said contact of said second diode having a polarity opposite of said contact of said first diode; and a median element interposed between said first element and said second element to electrically couple said first element to said second element, the median element responsive to temperature changes wherein the electrical contact between said first diode and said second diode is disconnected when the temperature of the median element exceeds a predetermined threshold.

6. An automotive rectifier assembly, comprising:

at least one semiconductor that converts alternating current to direct current; and at least one thermal disconnect element coupled along the circuit path of said rectifier assembly wherein said thermal disconnect element responds to a predetermined level of heat generated outside the thermal disconnect element by disconnecting from the circuit path, thereby inhibiting the current flow through said circuit path.

7. A method of protecting automotive rectifier assemblies from overheating, comprising:

providing a respective meltable circuit element in the circuit path of each semiconductor element of the rectifier assembly; and melting said circuit element when a predetermined amount of heat is dissipated from the respective semiconductor element.

8. A semiconductor assembly, comprising:

a cup, the cup including an elevated platform at its bottom;

a semiconductor chip, the semiconductor chip affixed to said elevated platform;

a cover, the cover adapted to seal the upper portion of the cup;

at least one electrically conductive lead extending through the cover into the cup; and a conductive element coupled between a contact of the semiconductor element and the electrical lead of the cover, wherein the conductive element melts when the semiconductor generates heat to raise the temperature of the semiconductor above a threshold level.

* * * * *